United States Patent

Saitoh et al.

[11] Patent Number: 5,835,837
[45] Date of Patent: Nov. 10, 1998

[54] APPARATUS FOR REMOVING IMAGE FORMING SUBSTANCE FROM IMAGE HOLDING MEMBER

[75] Inventors: Masatoshi Saitoh; Yasuhiro Takahashi, both of Tokyo; Hisao Watanabe, Sagamihara; Masaru Shinkai; Hiroshi Kondoh, both of Yokohama, all of Japan

[73] Assignee: Ricoh Company, Ltd., Tokyo, Japan

[21] Appl. No.: 943,591

[22] Filed: Oct. 3, 1997

Related U.S. Application Data

[63] Continuation of Ser. No. 626,781, Apr. 2, 1996, abandoned.

[30] Foreign Application Priority Data

| Apr. 6, 1995 | [JP] | Japan | 7-107913 |
| Jun. 9, 1995 | [JP] | Japan | 7-168231 |
| Jan. 25, 1996 | [JP] | Japan | 8-031459 |

[51] Int. Cl.$^6$ ............................. G03G 21/00; B08B 1/02
[52] U.S. Cl. ........................... 399/343; 15/102; 399/348; 399/349; 399/357
[58] Field of Search .................................... 399/343, 352, 399/348, 349, 353, 357; 15/102, 100, 1.51, 256.5

[56] References Cited

U.S. PATENT DOCUMENTS

| 4,870,465 | 9/1989 | Lindblad et al. | 399/349 X |
| 5,006,189 | 4/1991 | Tsukamoto et al. | |
| 5,353,108 | 10/1994 | Tsukamoto | |
| 5,463,447 | 10/1995 | Kurotori et al. | |
| 5,474,617 | 12/1995 | Saito et al. | |
| 5,545,381 | 8/1996 | Iida et al. | 399/1 X |
| 5,561,513 | 10/1996 | Lindblad | 118/652 X |
| 5,642,550 | 7/1997 | Maruyama et al. | 399/343 X |

FOREIGN PATENT DOCUMENTS

| 60-230899 | 11/1985 | Japan . |
| 61-213185 | 9/1986 | Japan . |
| 1-297294 | 11/1989 | Japan . |
| 2-55195 | 2/1990 | Japan . |
| 3-68460 | 7/1991 | Japan . |
| 4-64472 | 2/1992 | Japan . |
| 4-64473 | 2/1992 | Japan . |
| 4-67043 | 3/1992 | Japan . |
| 4-82983 | 3/1992 | Japan . |
| 4-333088 | 11/1992 | Japan . |
| 5-173454 | 7/1993 | Japan . |
| 5-216374 | 8/1993 | Japan . |
| 6-289754 | 10/1994 | Japan . |
| 7-121073 | 5/1995 | Japan . |
| 7-134524 | 5/1995 | Japan . |
| 7-160159 | 6/1995 | Japan . |
| 7-199754 | 8/1995 | Japan . |
| 7-199756 | 8/1995 | Japan . |
| 7-199757 | 8/1995 | Japan . |
| 7-287485 | 10/1995 | Japan . |
| 7-306614 | 11/1995 | Japan . |
| 7-311522 | 11/1995 | Japan . |

*Primary Examiner*—S. Lee
*Attorney, Agent, or Firm*—Oblon, Spivak, McClelland, Maier & Neustadt, P.C.

[57] ABSTRACT

An image forming substance removing apparatus for removing an image forming substance from an image holding member has a separating device for separating the image forming substance from the image holding member by separating a separating member having adhesive force stronger than adhesive force between the image holding member and the image forming substance attached onto this image holding member from the image forming substance on the image holding member after this separating member comes in contact with the image forming substance on the image holding member; and a cleaner for cleaning the separating member by removing the image forming substance attached onto the separating member therefrom. The cleaner has a cleaning member formed in a roller shape and having an edge-shaped member which comes in contact with a surface of the separating member and is formed in an outer circumferential portion of the cleaning member; and a driving device for rotating the cleaning member such that the image forming substance on the separating member comes in contact with the edge-shaped member of the cleaning member at least one time.

85 Claims, 12 Drawing Sheets

APPARATUS FOR REMOVING IMAGE FORMING SUBSTANCE FROM IMAGE HOLDING MEMBER

This application is a Continuation of application Ser. No. 08/626,781, filed on Apr. 2, 1996, now abandoned.

BACKGROUND OF THE INVENTION

1. Field of the Invention

The present invention relates to an image forming substance removing apparatus in which an image forming substance constituting an image formed by an image forming apparatus such as a copying machine, a facsimile telegraph, a printer, etc. is removed from an image holding member forming the image thereon. More particularly, the present invention relates to a cleaning technique of a separating member used in the image forming substance removing apparatus. Further, the present invention relates to an image forming substance removing apparatus for removing an image forming substance from an image holding member and preventing a reduction in performance of an image forming substance removing means.

2. Description of the Related Art

Various kinds of image forming substance removing methods and apparatuses for removing an image forming substance from an image holding member are generally proposed to reutilize the image holding member in view of effective utilization of resources, etc. For example, such image forming substance removing methods and apparatuses are shown in Japanese Patent Application Laying Open (KOKAI) Nos. 1-101576, 2-55195, 4-64472, 4-82983, 4-300395, etc. In particular, inventors of this patent application proposed an image forming substance removing method for removing only the image forming substance from the image holding member without relatively damaging the image holding member. In this method, at least one kind of water or aqueous solution selected from a group of water, an aqueous solution including a surfactant, an aqueous solution including a water-soluble polymer, and an aqueous solution including a surfactant and a water-soluble polymer is held in the image holding member. The image forming substance on the image holding member is heated to melt or soften this image forming substance. The image forming substance comes in contact with a separating member having adhesive force stronger than that between the image holding member and the image forming substance. When the separating member and the image holding member are separated from each other, the image forming substance is separated and removed from the image holding member. For example, this image forming substance removing method is proposed in Japanese patent application Nos. 4-255916, 5-239075, etc.

In the image forming substance removing method for removing the image forming substance from the image holding member as proposed in the above Japanese patent application No. 4-255916, etc., it is preferable to remove the image forming substance removed from the image holding member and attached onto the separating member and clean the separating member so as to maintain separating performance of the separating member. Therefore, for example, inventors of this patent application show a cleaner for cleaning a surface of the separating member in patent specifications of Japanese patent application Nos. 5-201172 and 7-18557. In this cleaner, for example, a brush roller as a rotating member for cleaning rotated at a high speed comes in contact with a surface of a belt for toner offset as a separating member formed in a belt shape and wound around a plurality of supporting rollers. The image forming substance on this belt is scraped off by this contact. FIG. 1 shows one constructional example of the cleaner in this general example. In FIG. 1, a brush roller 308 comes in contact with a surface of a toner offset belt 301 wound around a supporting roller 302, etc. The brush roller 308 rotates at a high speed with the supporting roller 302 as a backup roller. A metallic brush material is formed in a surface portion 308a of this brush roller 308. A cleaning blade 309 comes in contact with the surface of the belt 301 on a downstream side in a belt moving direction from a nipping portion between the brush roller 308 and the belt 301. The cleaning blade 309 scrapes off toner remaining on the surface of the belt 301.

In such a general cleaner, strong cleaning is required to completely remove the toner as an image forming substance strongly attached onto a surface of the separating member in a film shape in comparison with a case in which the remaining toner on a photosensitive drum is removed therefrom by an electrophotographic image forming apparatus. Accordingly, a loop-shaped material weaving stainless steel fibers therein and wound around a core bar is used as a brush material of the above brush roller. This brush roller must come in press contact with the surface of the separating member. Accordingly, the separating member is shaved by the brush roller so that there is a fear of a reduction in life of the separating member.

For example, FIG. 2 shows a generally proposed image forming substance removing apparatus in which an image forming substance such as toner, etc. is removed from a sheet of paper as a recorded image holding member.

The image forming substance removing apparatus for removing the image forming substance from the image holding member shown in FIG. 2 has a paper feed unit 20, a separating liquid supplying unit 30, a toner separating unit 40, an unillustrated drying unit and an unillustrated paper receiving unit. The paper feed unit 20 separates transfer paper sheets 10 stored in a stacking state as image holding members each having a toner image thereon from each other and feeds the transfer paper sheets 10 one by one. The separating liquid supplying unit 30 supplies a separating liquid to a transfer paper sheet 10 fed from the paper feed unit 20. The toner separating unit 40 is arranged as a separating means for separating toner from the transfer paper sheet 10 having the supplied separating liquid. The drying unit dries the transfer paper sheet 10 from which the toner is separated. The paper receiving unit receives the transfer paper sheet 10 discharged from the drying unit.

In the image forming substance removing apparatus shown in FIG. 2, the toner on the transfer paper sheet 10 having a toner image thereon is separated from this transfer paper sheet 10 as follows when the transfer paper sheet 10 passes through the toner separating unit 40.

Namely, the separating liquid 31 is uniformly supplied by the separating liquid supplying unit 30 to a toner image forming face of the transfer paper sheet 10 fed from the paper feed unit 20. A toner image is formed on this toner image forming face of the transfer paper sheet 10 and this toner image forming face is called a toner image face in the following description. This transfer paper sheet 10 is then fed to the toner separating unit 40. In this toner separating unit 40, the toner fixed to the transfer paper sheet 10 is softened by heat from a heating roller 45 and a backup member 46 and is attached onto the surface of a separating belt 44 as a toner separating member. When the transfer paper sheet 10 and the separating belt 44 are separated from each other by a separating roller 43, the toner attached onto the surface of the separating belt 44 is separated from the transfer paper sheet 10.

The separating belt 44 carrying the toner thereon is supported by belt supporting rollers 41 and 42 and is endlessly moved and conveyed to a belt cleaning section 50. In the belt cleaning section 50, the separating belt 44 passes through a contact portion between the belt supporting roller 42 and a rotating brush roller 51. At this time, the toner on the separating belt 44 is frictionally rubbed and is scraped off by the rotating brush roller 51 rotating at a high speed. This toner is then stored into a toner collecting container 52 arranged such that the rotating brush roller 51 is surrounded by the toner collecting container 52.

However, the image forming substance removing apparatus constructed above has the following problems.

Firstly, a metallic hard material is used as a brush arranged in the above rotating brush roller. The image forming substance is scraped off from the separating belt by strongly pressing this hard brush against the surface of the separating belt endlessly moved. Therefore, the separating belt surface repeatedly comes in press contact with the hard brush and is shaped so that life of the separating belt is shortened.

Secondly, when the image holding member is constructed by a weak paper sheet composed of paper fibers, paper fibers are also attached onto the separating belt when the image forming substance is transferred onto the separating belt with strong adhesive force as mentioned above. When the paper fibers are attached onto the separating belt together with the image forming substance, cleaning efficiency of the image forming substance on the separating belt using frictional rubbing of the rotating brush roller is reduced so that no image holding member of weak paper fibers can be processed.

Thirdly, it is necessary to rotate the rotating brush roller at a high speed so as to improve cleaning performance. Therefore, the image forming substance scraped off by the rotating brush roller and shaved powder of the separating belt are scattered so that the interior of the image forming substance removing apparatus becomes dirty.

Fourthly, it is difficult to accurately manufacture the rotating brush roller. Therefore, when the rotating brush roller is rotated at a high speed, the rotating brush roller comes in irregular contact with the separating belt so that noises are caused in many cases.

Further, a load applied to the cleaning brush roller is large so that a driving system including a motor for rotating this cleaning brush roller, etc. is large-sized and cost of the image forming substance removing apparatus is increased.

SUMMARY OF THE INVENTION

It is therefore a first object of the present invention to provide an image forming substance removing apparatus for removing an image forming substance from an image holding member and having a cleaner of a separating member in which damage of a surface of the separating member is restrained to a wearing extent and durability of the separating member can be improved in comparison with a case in which a brush roller is rotated at a high speed by making the brush roller come in press contact with the separating member.

A second object of the present invention is to provide an image forming substance removing apparatus capable of accurately removing an image forming substance from an image holding member irrespective of a material of the image holding member.

The above objects can be achieved by an image forming substance removing apparatus for removing an image forming substance from an image holding member and comprising:

a separating device for separating the image forming substance from the image holding member by separating a separating member having adhesive force stronger than adhesive force between the image holding member and the image forming substance attached onto this image holding member from the image forming substance on the image holding member after this separating member comes in contact with the image forming substance on the image holding member; and a cleaner for cleaning the separating member by removing the image forming substance attached onto the separating member therefrom;

the cleaner comprising:

a cleaning member formed in a roller shape and having an edge-shaped member which comes in contact with a surface of the separating member and is formed in an outer circumferential portion of the cleaning member; and driving means for rotating the cleaning member such that the image forming substance on the separating member comes in contact with the edge-shaped member of the cleaning member at least one time.

In this construction, damage of the surface of the separating member is restrained to a wearing extent and durability of the separating member can be improved in comparison with a case in which a brush roller is rotated at a high speed by making the brush roller come in press contact with the separating member.

Further, the image forming substance can be accurately removed from the image holding member irrespective of a material of the image holding member.

Further objects and advantages of the present invention will be apparent from the following description of the preferred embodiments of the present invention as illustrated in the accompanying drawings.

BRIEF DESCRIPTION OF THE DRAWINGS

FIG. 11b is a cross-sectional view of a spiral roller and a cylindrical member of a cover in the cleaner shown in FIG. 11a;

Figure 13A:
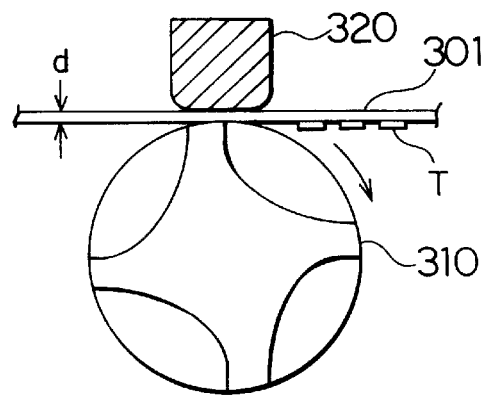
Figure 13B:
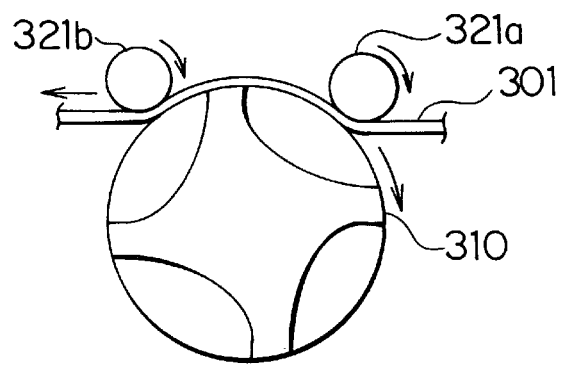
Figure 14:
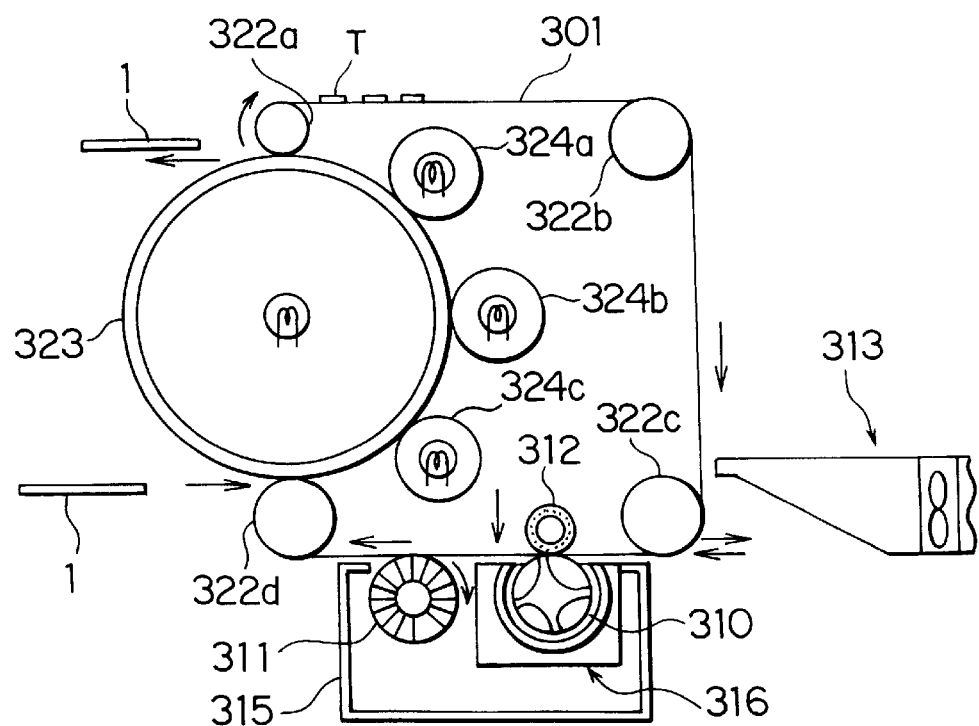
Figure 15:
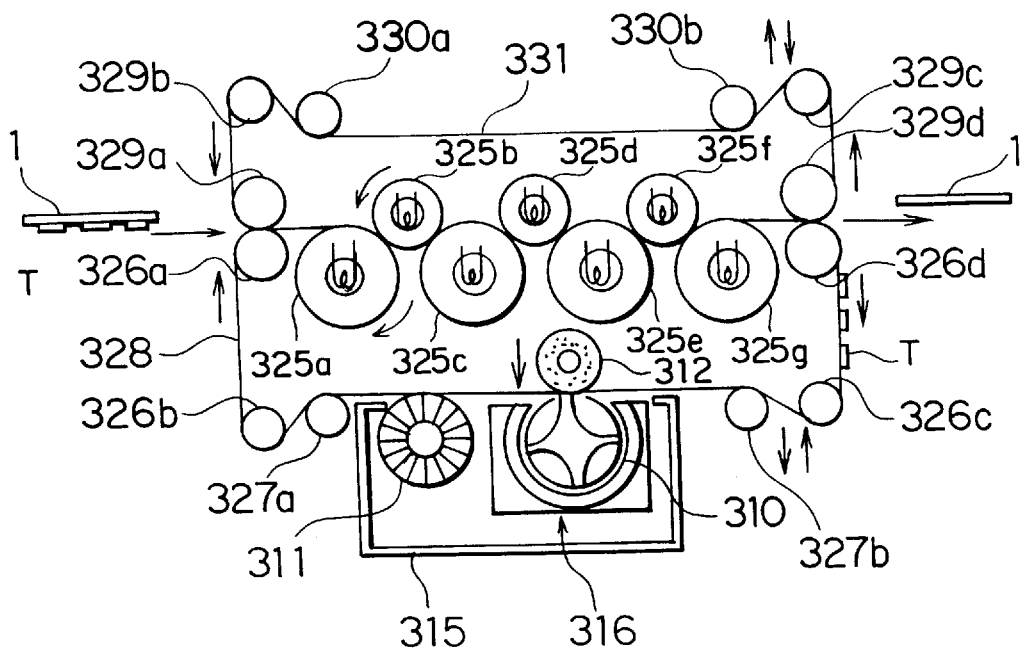
Figure 16:
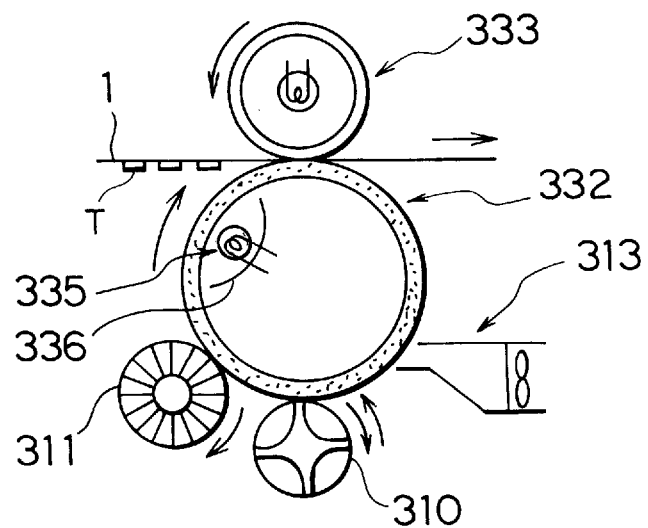
Figure 17A:
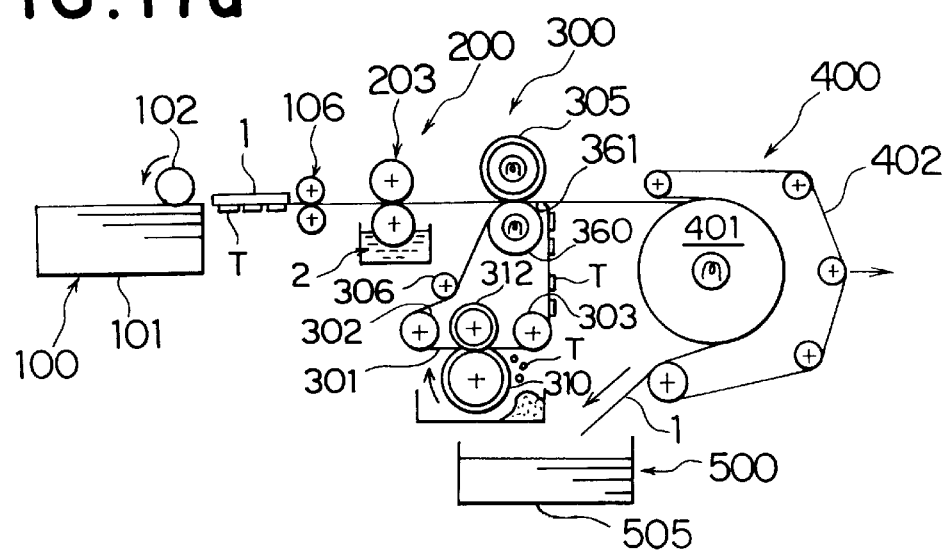
Figure 17B:
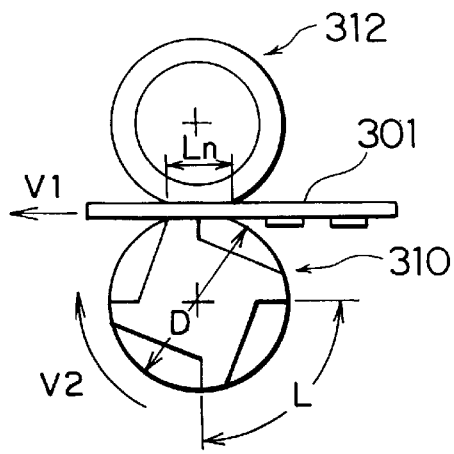
Figure 17C:
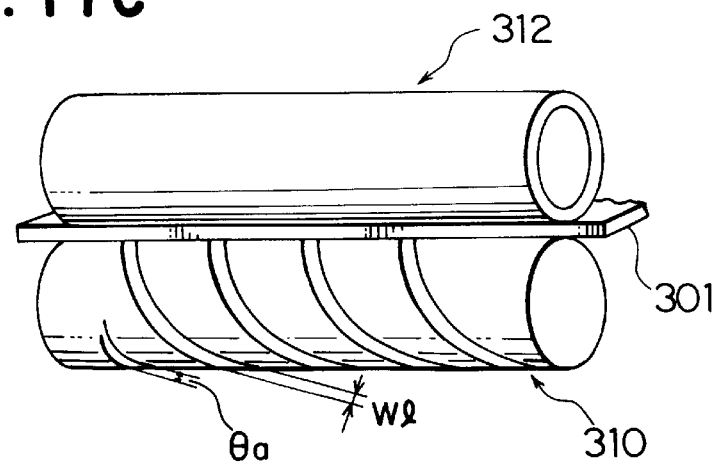
Figure 18:
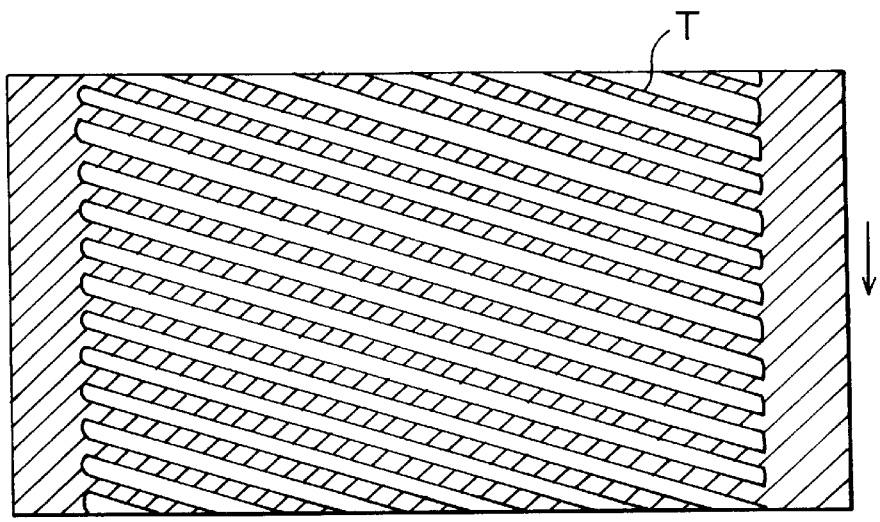
Figure 19:
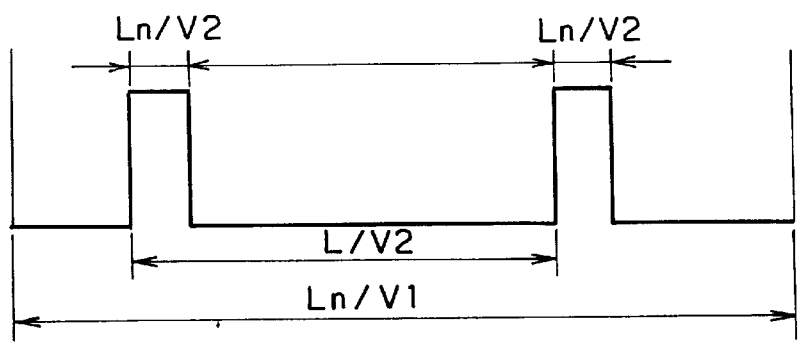
Figure 20:
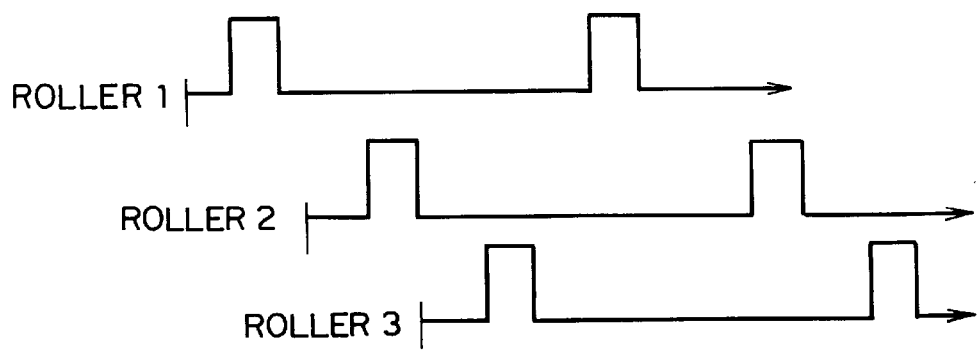
Figure 21:
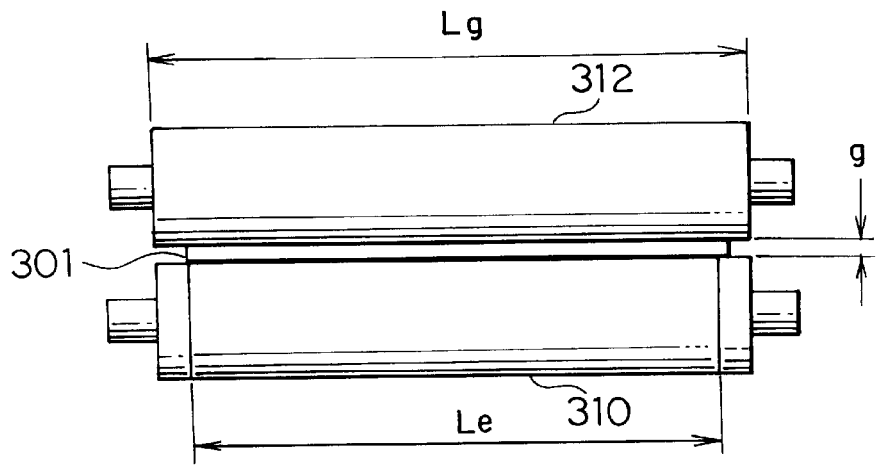
Figure 22A:
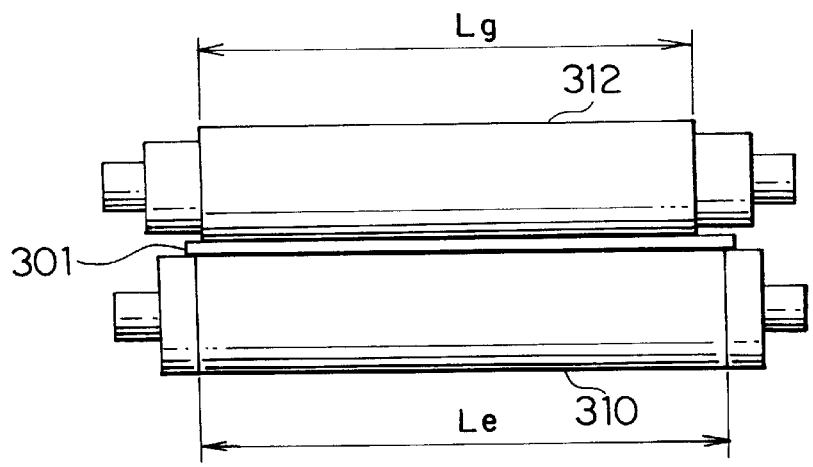
Figure 22B:
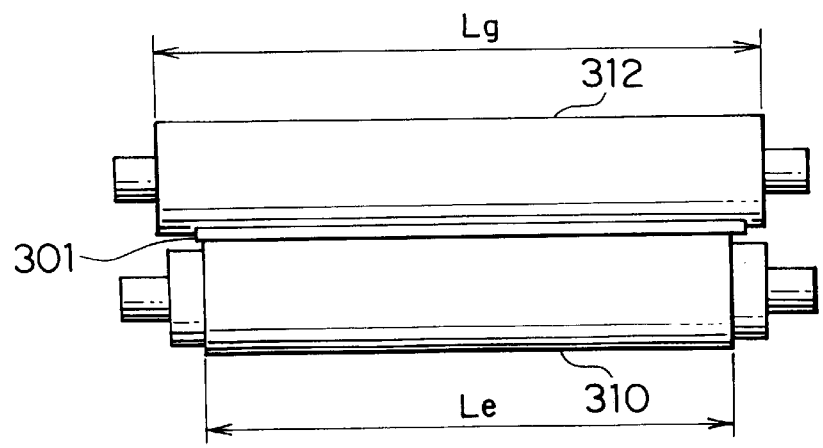
Figure 23A:
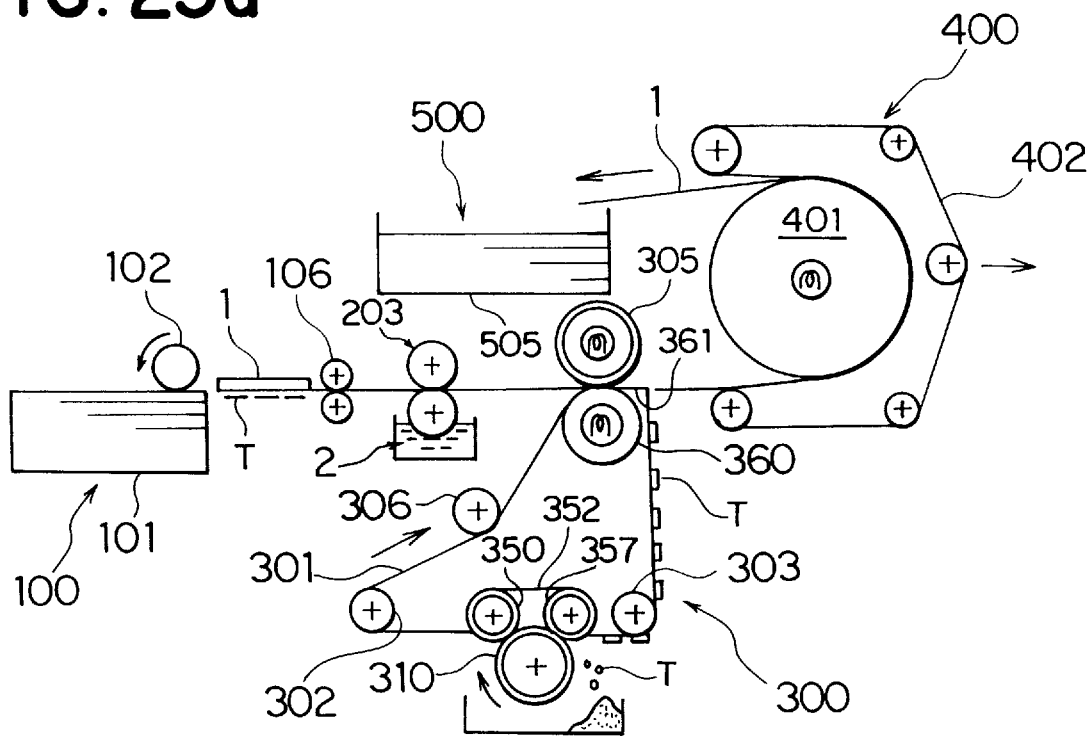
Figure 23B:
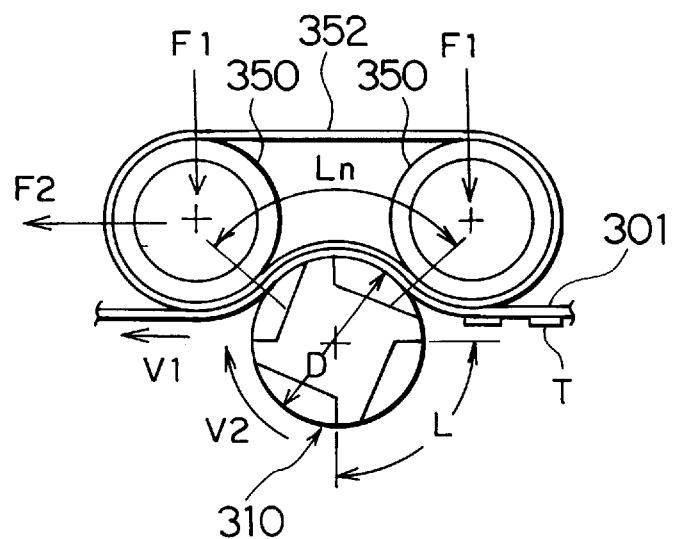
Figure 24:
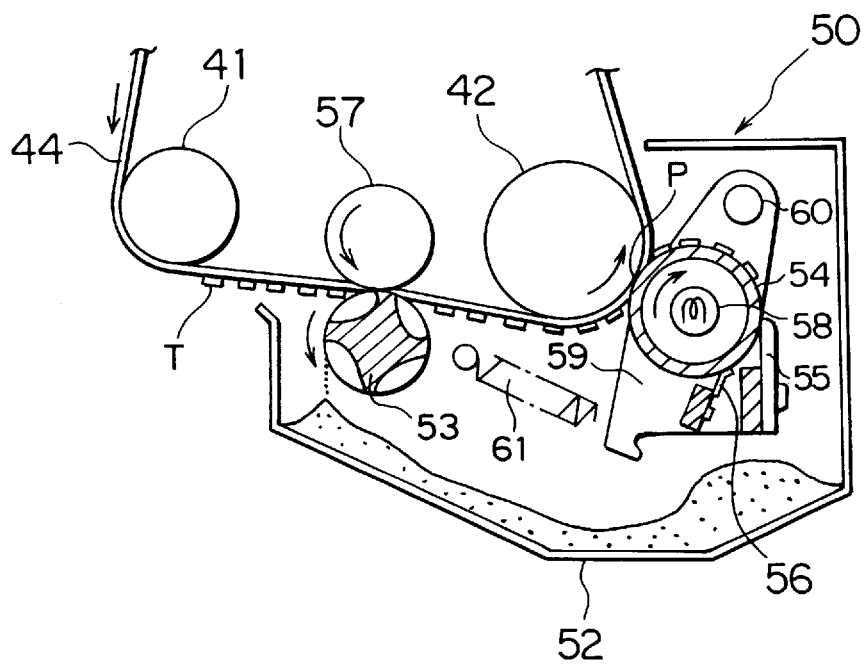

each of FIGS. 13a and 13b is a front view showing a schematic construction of another modified example of a backup member;

FIG. 14 is a front view showing the schematic construction of a cleaner used in a toner removing apparatus in another embodiment form;

FIG. 15 is a front view showing the schematic construction of a toner separating unit used in a toner removing apparatus in another embodiment form;

FIG. 16 is a front view showing a toner separating unit used in a toner removing apparatus in another embodiment form;

FIG. 17a is a front view showing a toner separating unit used in a toner removing apparatus in another embodiment form;

FIGS. 17b and 17c are respectively an enlarged front view and an enlarged perspective view of a spiral roller and a backup roller used in the toner removing apparatus shown in FIG. 17a;

FIG. 18 is an explanatory view of cleaning remainings formed in a stripe shape on an offset belt;

FIG. 19 is a time chart for explaining a cleaning operation using a spiral roller;

FIG. 20 is a time chart for explaining a cleaning operation using a plurality of spiral rollers;

FIG. 21 is a side view of a spiral roller and a backup roller in one modified example;

each of FIGS. 22a and 22b is a side view of a spiral roller and a backup roller in another modified example;

FIG. 23a is a front view showing a toner separating unit used in a toner removing apparatus in another embodiment form;

FIG. 23b is an enlarged front view of a spiral roller and a backup roller used in the toner removing apparatus shown in FIG. 23a; and FIG. 24 is a front view of a main portion of an image forming substance removing apparatus for removing an image forming substance from an image holding member in accordance with another embodiment of the present invention.

DESCRIPTION OF THE PREFERRED EMBODIMENTS

The preferred embodiments of an image forming substance removing apparatus in the present invention will next be described in detail with reference to the accompanying drawings.

The following explanation relates to embodiment forms of the present invention in which the present invention is applied to a toner removing apparatus for removing thermally melted toner as an image forming substance from a sheet of transfer paper as an image holding member forming an image thereon by an electrophotographic copying machine of a transfer type. In the following description, the thermally melted toner is simply called toner.

Embodiment Form 1

Figure 4:
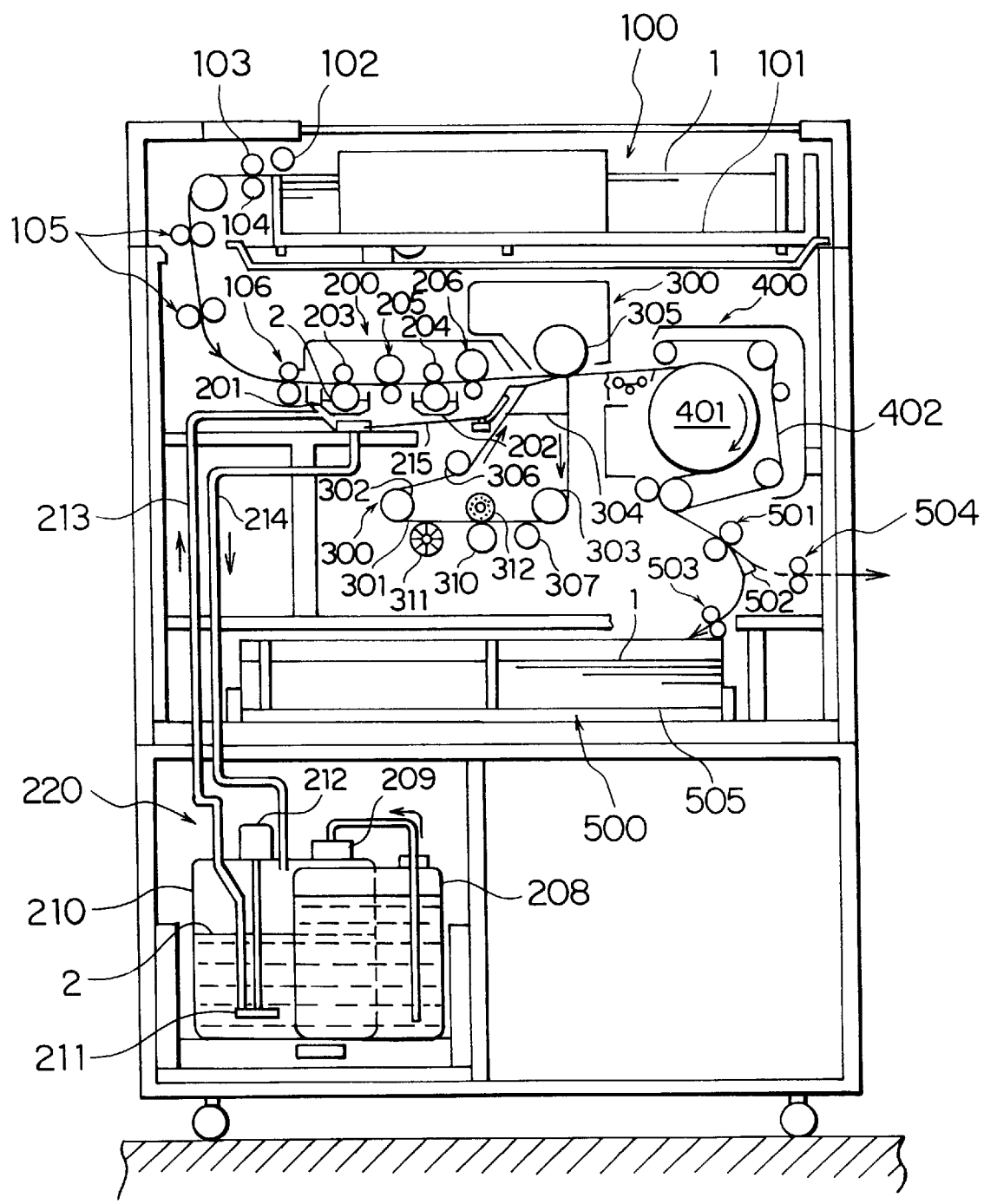
FIG. 4 is a front view showing an entire construction of this toner removing apparatus.

FIG. 4 is a view showing the schematic construction of a toner removing apparatus in accordance with a first embodiment form of the present invention. The entire schematic construction of this toner removing apparatus will first be explained. This toner removing apparatus has a paper feed unit 100, a liquid providing unit 200, a liquid supplying device 207, a toner separating unit 300, a drying unit 400 and a paper receiving unit 500. The paper feed unit 100 separates transfer paper sheets 1 each forming a toner image thereon and stored in a stacking state from each other and feeds the transfer paper sheets 1 one by one. The liquid providing unit 200 as an unstabilizing liquid providing means provides an unstabilizing liquid to one transfer paper sheet 1 fed from the paper feed unit 100. The liquid supplying device 207 supplies a processing liquid 2 described later to the liquid providing unit 200. The toner separating unit 300 as a separating means separates and removes toner from the transfer paper sheet 1 having the supplied unstabilizing liquid. The drying unit 400 dries the transfer paper sheet 1 from which the toner is removed. The paper receiving unit 500 receives the transfer paper sheet 1 discharged from the drying unit 400.

In the above paper feed unit 100, transfer paper sheets 1 stacked on a bottom plate 101 are fed by a paper feed roller 102 from an uppermost sheet. Overlapped paper sheets are separated from each other by a separating mechanism composed of a feed roller 103 and a separate roller 104 so that only one transfer paper sheet 1 is fed. The transfer paper sheet 1 fed from this paper feed unit 100 is conveyed by conveying roller pairs 105. A timing adjustment and a skew correction of this transfer paper sheet 1 are made by a resist roller pair 106. Thus, this transfer paper sheet 1 is fed to the next liquid providing unit 200. Concrete constructions and operations of the above paper feed unit 100, etc. are similar to those of a paper feed mechanism in an electrophotographic copying machine and a detailed explanation thereof is therefore omitted in the following description.

The above liquid providing unit 200 has liquid coating devices 201 and 202 each constructed by a liquid container and a liquid coating roller and arranged at two stages in a conveying direction of the transfer paper sheet 1. The liquid container is filled with a predetermined amount of processing liquid 2 as an unstabilizing liquid for changing an attaching state of the transfer paper sheet 1 and the toner to an unstable state. The liquid coating roller is arranged such that the liquid coating roller is partially dipped into the unstabilizing liquid within the liquid container. Paper restricting rollers 203 and 204 are respectively arranged above the liquid coating rollers of the coating devices 201 and 202 such that surfaces of the paper restricting rollers 203 and 204 are respectively opposed to surfaces of the liquid coating rollers at predetermined intervals. A relay roller pair 205 for conveying the transfer paper sheet is arranged between the liquid coating device 201 at a first stage and the coating device 202 at a second stage in the conveying direction of the transfer paper sheet 1. A relay roller pair 206 for conveying the transfer paper sheet is arranged on a downstream side of the coating device 202 at the second stage. A paper receiving tank 215 is arranged below the respective liquid coating devices 201, 202, the relay roller pairs 205, 206, etc.

The above processing liquid 2 can be constructed by using at least one kind of water or aqueous solution selected from a group of water, an aqueous solution including a water-soluble polymer, an aqueous solution including a surfactant, and an aqueous solution including a water-soluble polymer and a surfactant.

The above liquid supplying device 207 is constructed by an exchangeable replenishment liquid bottle 208, a processing liquid tank 210, a liquid supplying pump 211, a pump motor 212, a liquid supplying pipe 213, a collecting pipe 214, etc. The replenishment liquid bottle 208 is arranged in a lower portion of the liquid supplying device 207. The processing liquid 2 is suitably supplied from the replenishment liquid bottle 208 to the processing liquid tank 210 by an electromagnetic pump 209. The liquid supplying pump 211 is built in the processing liquid tank 210 and is constructed by a blade pump, etc. The pump motor 212 rotates the liquid supplying pump 211. The liquid supplying pipe 213 is arranged to feed the processing liquid 2 from the liquid supplying pump 211 to the liquid containers 201 and 202. The processing liquid 2 discharged from a liquid discharging port formed in a lower portion of each of the liquid containers 201 and 202 to the liquid receiving tank 215 is returned into the processing liquid tank 210 through the collecting pipe 214. The processing liquid 2 fed by the liquid supplying pump 211 is supplied to the liquid containers of the liquid coating devices 201 and 202 through the liquid supplying pipe 213. The processing liquid 2 flowing out of the liquid containers and received by the above liquid receiving tank 215 is returned into the processing liquid tank 210 through the collecting pipe 214 so that the processing liquid 2 is circulated. A liquid supplying amount of the liquid supplying pump 211, etc. are set such that predetermined amounts of the liquid coating rollers are dipped into the processing liquid 2 within the liquid containers in the respective liquid coating devices 201 and 202 during such a stationary circulating operation of the processing liquid 2.

The above toner separating unit 300 has a belt 301 for toner offset (called a toner offset belt in the following description), a heating block 304, an upper heating roller 305, tension rollers 306, 307, and a cleaner. The toner offset belt 301 is arranged as a separating member formed in a belt shape and wound around a plurality of supporting rollers (driving rollers) 302, 303, etc. A heating lamp is built in each of the heating block 304 and the upper heating roller 305 coming in contact with each other through the offset belt 301. Each of the tension rollers 306 and 307 provides a predetermined tensile force to the offset belt 301. The cleaner cleans a surface of the offset belt 301. This cleaner will be described in detail later.

The above heating block 304 and the above upper heating roller 305 are used to make a toner image face of the transfer paper sheet 1 come in close contact with the offset belt 301 and heat and soften toner fixed to the transfer paper sheet 1 at a temperature equal to or higher than a softening temperature of the toner. The softening temperature of the toner used in this embodiment form is set to about 50° to 60° C. Softening temperatures of the toner are different from each other in accordance with kinds of the toner.

At least a side surface of the above offset belt 301 coming in contact with the toner is formed by a material having adhesive force to the softened toner stronger than adhesive force between a surface of the transfer paper sheet 1 and the softened toner. In this embodiment form, a belt of polyethylene terephthalate (PET) having a diffused titanium oxide having 100 μm in thickness is used. However, for example, the offset belt may be constructed by using a metallic material such as aluminum, copper, nickel, etc., a polymer material such as polyether ether ketone (PEEK), etc. except for PET.

A bent portion is formed on a downstream side of the offset belt 301 in its moving direction from a press contact portion of the above heating block 304 coming in press contact with the upper heating roller 305. The bent portion approximately changes the moving direction of the offset belt 301 by 90 degrees with a predetermined curvature radius. The moving direction of the offset belt is suddenly changed around this bent portion so that the transfer paper sheet 1 is separated from the offset belt 301 by using curvature.

For example, the above drying unit 400 dries the transfer paper sheet 1 such that a liquid holding amount of the transfer paper sheet 1 is equal to or smaller than 10% of a paper weight. The drying unit 400 is constructed by a heating drum 401 and a belt 402 for pressing the transfer paper sheet. For example, the heating drum 401 is formed by aluminum and a heating lamp is built in the heating drum 401. The paper pressing belt 402 is wound around a plurality of supporting rollers and is endlessly moved in a state in which the paper pressing belt 402 is wound around a circumferential face of the heating drum 401 at a constant angle. The paper pressing belt 402 can be constructed by using a material having heat resistance and gas permeability such as a cloth of a canvas texture, a cotton texture, a tetronic texture, etc.

The above paper receiving unit 500 is constructed by a conveying roller pair 501 for conveying the transfer paper sheet 1 from the drying unit 400, a branching claw 502, discharging roller pairs 503, 504, a built-in paper discharging tray 505, an unillustrated external paper discharging tray, etc. The paper receiving unit 500 can select a paper discharge to the built-in paper discharging tray 505 or the external paper discharging tray in accordance with necessity. The built-in paper discharging tray 505 is slidably constructed such that the built-in paper discharging tray 505 can be pulled out on this side of the toner removing apparatus.

In the toner removing apparatus constructed above, the processing liquid 2 is provided to a toner image face of a transfer paper sheet 1 fed from the paper feed unit 100 by the liquid providing unit 200. The toner image face is set to a lower face of the transfer paper sheet in FIG. 4. This transfer paper sheet is fed to the toner separating unit 300. For example, 2 g (grams) or more of processing liquid 2 is provided to the transfer paper sheet 1 of size A4. In this toner separating unit 300, toner fixed to the transfer paper sheet 1 is softened by heat from each of the heating block 304 and the upper heating roller 305 so that the toner is attached to a surface of the offset belt 301. When the transfer paper sheet 1 is separated from the offset belt 301 around the bent portion of the heating block 304, the toner attached to the surface of the offset belt 301 is separated from the transfer paper sheet 1 so that the toner is removed from the transfer paper sheet 1. The transfer paper sheet 1 removing the toner therefrom is dried by the drying unit 400 and is discharged onto the built-in paper discharging tray 505 of the paper receiving unit 500 by the paper discharging roller pair 503. The toner is separated from the transfer paper sheet 1 by the above toner removing processing in a state in which the processing liquid is supplied to the transfer paper sheet 1 having the attached toner and permeates an interfacial portion between the transfer paper sheet 1 and the toner. Accordingly, the toner can be removed from the transfer paper sheet without damaging paper fibers.

Figure 3:
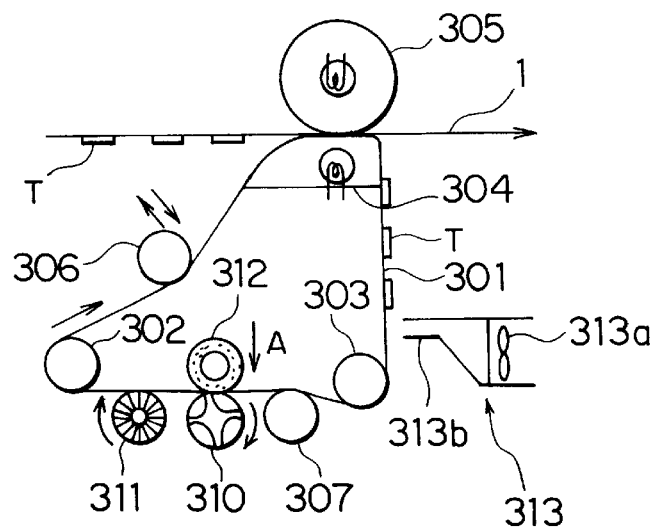
FIG. 3 is a front view showing the schematic construction of a toner separating unit in a toner removing apparatus in accordance with an embodiment form of the present invention.

The cleaner for cleaning the surface of the offset belt 301 will next be described in detail. As shown in FIG. 3, this cleaner has a spiral roller 310 and a brush roller 311. The spiral roller 310 as a cleaning member is formed in a roller shape and has a spiral edge coming in contact with the surface of the offset belt 310 in an outer circumferential portion of this spiral roller. The brush roller 311 as an auxiliary cleaning means removes the remaining toner from the surface of the offset belt 301 passing through a contact portion between the spiral roller 310 and an unillustrated driving device as a driving means for rotating the spiral roller 310.

Figure 5:
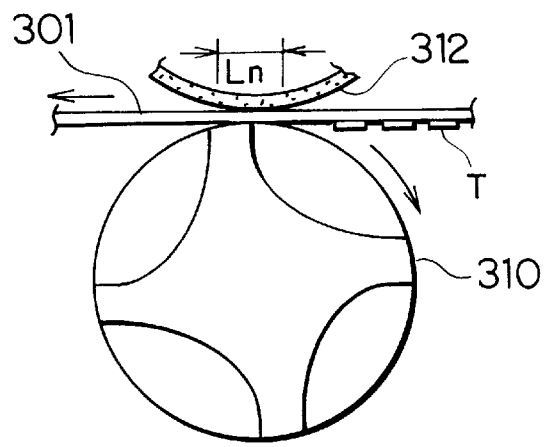
FIG. 5 is a view for explaining a nipping portion between a spiral roller and a backup roller used in a cleaner of the toner removing apparatus.

A backup roller 312 as a backup member comes in press contact with the above spiral roller 310 through the offset belt 301 in the direction of an arrow A. A surface portion of this backup roller 312 is constructed by an elastic material and forms a press contact portion of a nipping width (supporting width) Ln as shown in FIG. 5 by press contact between the backup roller 312 and the spiral roller 310. An edge of the spiral roller 310 comes in contact with a toner attaching face of the offset belt 301 by the press contact of this backup roller 312 with a predetermined contact force so that the toner can be reliably scraped from the offset belt 301 by this edge.

Figure 6:
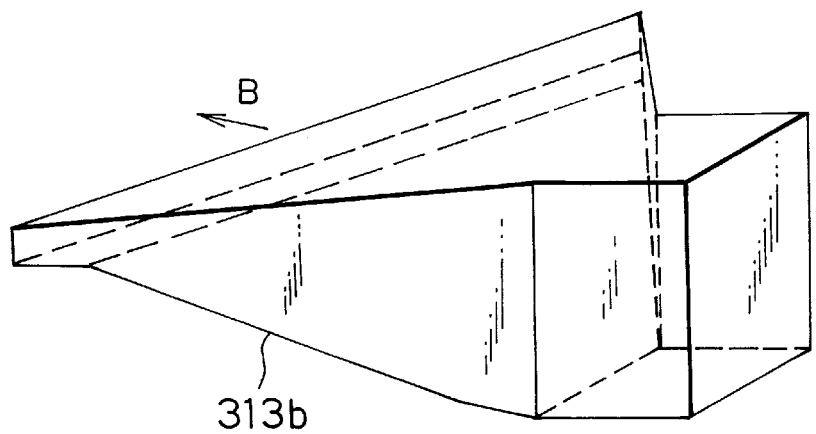
FIG. 6 is a perspective view of a cooling nozzle of a cooling device arranged in this cleaner.

Toner T heated and softened by the above heating block 304, etc., tends to be insufficiently scraped from the offset belt when this toner T is scraped as it is. In the case of a general brush roller using stainless steel fibers, the toner tends to be further insufficiently scraped from the offset belt. Therefore, the toner removing apparatus has a cooling device 313 as a cooling means for cooling the toner on the offset belt 301 before the toner is removed by the spiral roller 310. The toner on the offset belt 301 is cooled to a temperature equal to or lower than 50° C. as a softening temperature by this cooling device 313. Thereafter, the toner is scraped from the offset belt 301 by the above spiral roller 310. The above cooling device 313 is constructed by a cooling fan 313a, a cooling nozzle 313b (see a perspective view shown in FIG. 6), etc. As can be seen from FIG. 6, the cooling device 313 cools the toner T on the offset belt 301 by blowing out the air in the direction of an arrow B approximately along an entire width of the offset belt 301.

Figure 7A:
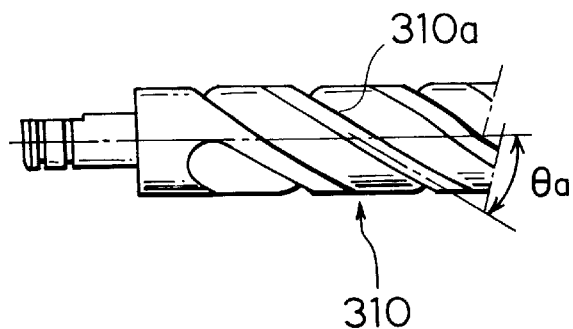
FIG. 7a is a partial side view of the spiral roller.
Figure 7B:
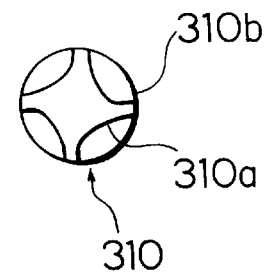
FIG. 7b is a cross-sectional view of the spiral roller.

A spiral edge of the above spiral roller 310 may be formed in a shape shown in attached view 72 of JIS (Japanese Industrial Standard)-B0172, a shape of core drill of JIS-B0171, a shape illustrated in view 52 of JIS-0173, or a shape in which a band member is wound around a core bar, etc. In this embodiment form, the spiral roller 310 is constructed by using four spiral edges 310a as shown in FIGS. 7a and 7b. When the four spiral edges 310a are used, the practical usable range of a torsion angle θ a (see FIG. 7a and attached view 76 of JIS-B0172) of each of the spiral edges is set to about 5° to 60° and is desirably set to range from 12° to 45°. The number of spiral edges 310a of the spiral roller 310 may be set to one, two or more. When the torsion angle θ a of each of the spiral edges 310a is large, the number of spiral edges may be set to one. However, when the torsion angle θ of each of the spiral edges is small (including the case of θ a=0°), it is preferable to rotate the spiral roller 310 at a higher linear velocity by increasing the number of spiral edges. The number of spiral edges 310a is preferably set to about 4 to 12 in consideration of a preferable contact property of an edge portion 310b of each of the spiral edges 310a with respect to toner and restraint of noises of the spiral edges at a rotating time thereof. The number of spiral edges 310a is more preferably set to about 6 to 12.

Figure 8:
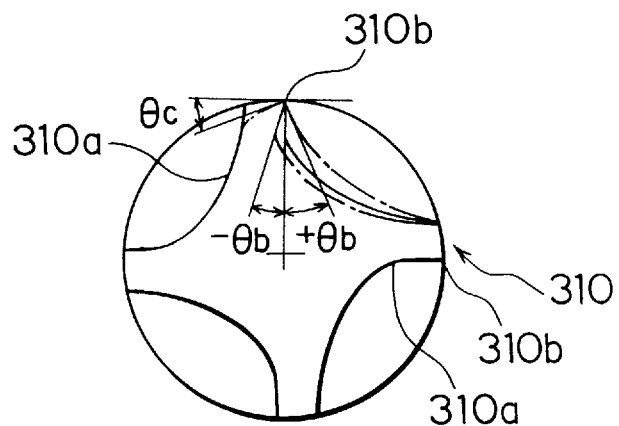
FIG. 8 is a view for explaining a rake angle θ b of the spiral roller and a relief angle θ c of an outer circumferential face of the spiral roller.

Different from a normal edge tip for mechanical processing, no cutting edge is attached to the edge portion 310b of a spiral edge 310a of the above spiral roller 310. Namely, a rake angle θ b for the cutting edge and a relief angle θ c (see FIG. 8) on an outer circumferential face of the spiral edge 310a are not positively formed in the edge portion 310b of the spiral edge 310a. Thus, toner can be separated from the offset belt 301 without shaving the offset belt 301 with the edge portion 310b of the spiral roller 310 while the toner is rubbed. Accordingly, damage of the surface of the offset belt 301 repeatedly used is restrained to a wearing extent so that durability of the offset belt 301 can be improved. Further, it is not necessary to positively provide the relief angle θ c on the outer circumferential face of the above spiral edge 310a. Accordingly, the spiral edge 310a can be easily processed. When a tip of the edge portion 310b is damaged, the edge tip can be reprocessed while an outside shape of the spiral roller 310 is maintained. Namely, the edge tip can be reprocessed without reducing an outside diameter of the spiral roller 310.

A usable range of the above rake angle θ b is set to about +60° to −10° and is more desirably set to a range from 0° to +45°. In the spiral roller 310 in this embodiment form, both the rake angle θ b and the relief angle θ c on the outer circumferential face of the spiral edge 310a are approximately set to 0°.

The above spiral roller 310 may be constructed by a material having a surface hardness harder than that of resin. For example, the spiral roller 310 can be constructed by using stainless steel, a normal cutter material formed by carbon tool steel/SK material, SKH material, etc.

Figure 9:
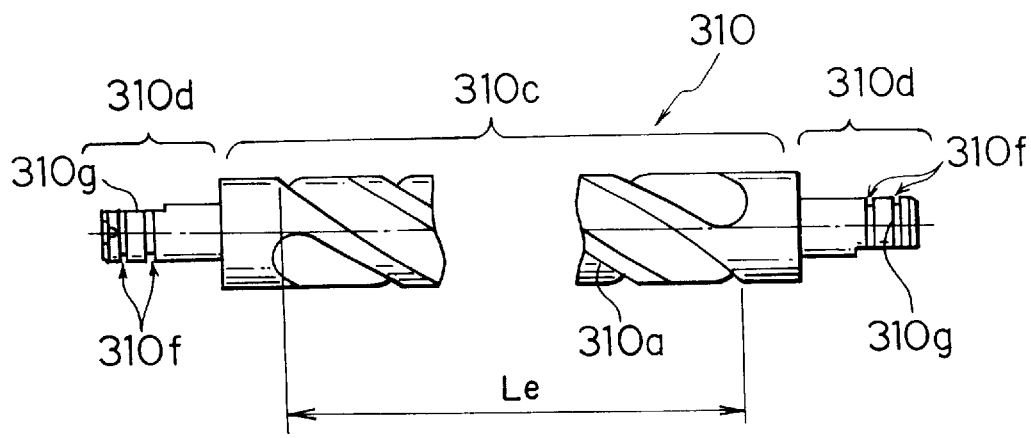
FIG. 9 is a side view of the spiral roller.

As shown in FIG. 9, the above spiral roller 310 is constructed by a roller body 310c and a bearing portion 310d formed in each of both end portions of the roller body 310c. A spiral edge 310a having an edge 310b for scraping off the above toner is formed in the roller body 310c. In the constructional example of FIG. 9, each of the both end portions of the roller body 310c has a straight portion approximately having the same outside diameter as a forming portion of the spiral edge 310a. However, this straight portion may not be necessarily formed. A central hole 310e having a conical inner face is formed in an end portion of the above bearing portion 310d. A plurality of E-ring grooves 310f and D-cut portions 310g are formed on an outer circumferential face of the bearing portion 310d. Shapes of the bearing portions 310b at both the ends of the spiral roller 310 are preferably set to the same shape. The bearing portions 310b of the spiral roller 310 are easily processed by setting the shapes of the bearing portions 310b to the same shape. Accordingly, a degree of freedom of an arranging place of the cleaner in a body of the toner removing apparatus is increased.

When the above spiral roller 310 is processed, the spiral edge 310a of the roller body 310c, the bearing portions 310d, etc. are simultaneously processed while a jig for processing is inserted into the central hole 310e formed at each of both the ends of the bearing portions 310d of the above spiral roller 310 and is rotated. Core vibration, eccentricity, etc. are not caused by such processing so that a processing accuracy of the spiral roller is maintained and the spiral roller 310 can be mounted to the toner removing apparatus body. Accordingly, it is possible to prevent toner from being irregularly removed by core vibration, eccentricity, etc. of the spiral roller 310.

Figure 10:
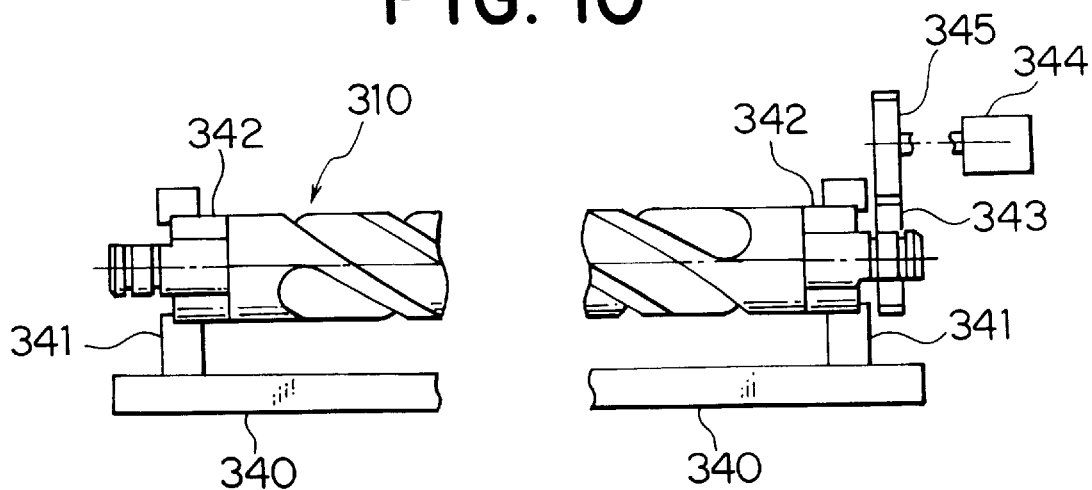
FIG. 10 is a view for explaining attachment of the spiral roller to an apparatus body.

FIG. 10 is a side view of the spiral roller 310 mounted to the cleaner in the toner removing apparatus. A side substrate 341 is attached to a bottom substrate 340 of the cleaner. An outside ring portion of a bearing 342 is inserted into this side substrate 341 and an inside ring portion of the bearing 342 is inserted into a bearing portion 310b of the above spiral roller 310 so that the spiral roller 310 is assembled. Thus, the spiral roller 310 can be mounted to the toner removing apparatus body by such assembly while the above processing accuracy is maintained.

A rotating driven member 343 is inserted into one bearing portion 310d of the above spiral roller 310 and is fixed by an unillustrated E-ring attached to an E-ring groove 310f such that no rotating driven member 343 is pulled out of the bearing portion 310d. Rotating driving force of a driving source 344 is transmitted to the spiral roller 310 through a rotating driving member 345 connected to the driving source 344 and the above rotating driven member 343 so that the spiral roller 310 is rotated at a predetermined speed. FIG. 10 shows a constructional example in which the rotating driven member 343 is attached onto a right-hand side of the spiral roller 310. However, the toner removing apparatus may be constructed such that this rotating driven member 343 is attached to an opposite side end portion of the spiral roller 310 on the left-hand side in FIG. 8.

An accuracy of a contact face between the spiral roller 310 and the offset belt 301 is improved by supporting and rotating the bearing portions 310b in both end portions of the spiral roller 310 by the bearings 342. Further, a uniform width (nipping width Ln) of the contact face is obtained and toner can be separated and removed from the offset belt without any irregularities.

A length Le (see FIG. 9) of a spiral edge forming portion of the spiral roller 310 in the direction of a rotating axis thereof is preferably set to be equal or shorter than an effective separating width of the offset belt 301 so as to prevent the offset belt 301 from being abnormally shaved and damaged by flapping of the offset belt 301, etc. in both end portions of the spiral roller 310 in its rotating axis direction. For example, the length Le of the spiral edge forming portion of the spiral roller 310 in the rotating axis direction is preferably set to be shorter than a width of the offset belt 301 by a length a in consideration of a shift of the offset belt 301 in its width direction when the offset belt 301 is repeatedly used.

Further, when the above transfer paper sheet 1 (an original to be processed) is shifted in a direction perpendicular to a conveying direction of the transfer paper sheet, the length Le of an edge forming portion of the spiral edge 310a in the rotating axis direction is preferably set to be equal to or greater than a maximum width of the transfer paper sheet 1 so as to secure a regenerating width of the offset belt 301 for toner removal. For example, the length Le of the spiral edge forming portion of the spiral roller 310 in the rotating axis direction is preferably set to be longer than the maximum width of the transfer paper sheet 1 by the length α in consideration of the shift of the transfer paper sheet 1 in the width direction at a toner separating processing time.

In this embodiment form, the spiral roller 310 is rotated at a linear velocity higher than that of the offset belt 301 such that toner T on the offset belt 301 comes in contact with a spiral edge of the spiral roller 310 at least one time. Thus, the toner T on the offset belt 301 can be reliably scraped by this spiral edge. More concretely, the toner T on the offset belt 301 can be removed therefrom by rotating the spiral roller 310 at a linear velocity 3 to 50 times the linear velocity of the offset belt 301. An optimum condition of this rotation is changed by the number of spiral edges of the spiral roller 310, the nipping width Ln, the shape of an edge tip, an attaching state of the toner T, etc. For example, in this embodiment form, the toner T on the offset belt 301 can be completely removed therefrom under a condition in which an outside diameter of the spiral roller 310 is 24 mm φ and the number of rotations of the spiral roller 310 is 300 rpm, and the nipping width Ln is about 1.5 mm, and the linear velocity of the offset belt 301 (formed by a PET film including a titanium oxide and having 100 μm in thickness) is 24 mm/sec. Namely, in the case of this concrete example, there is an optimum condition in which the linear velocity of the spiral roller 310 is about 15 times the linear velocity of the offset belt 301. A rotating direction of the spiral roller 310 is set to be reverse to a moving direction of the offset belt 301 in this embodiment form, but may be set to the same direction as the moving direction of the offset belt 301 if the above linear velocity condition is satisfied.

Figure 11A:
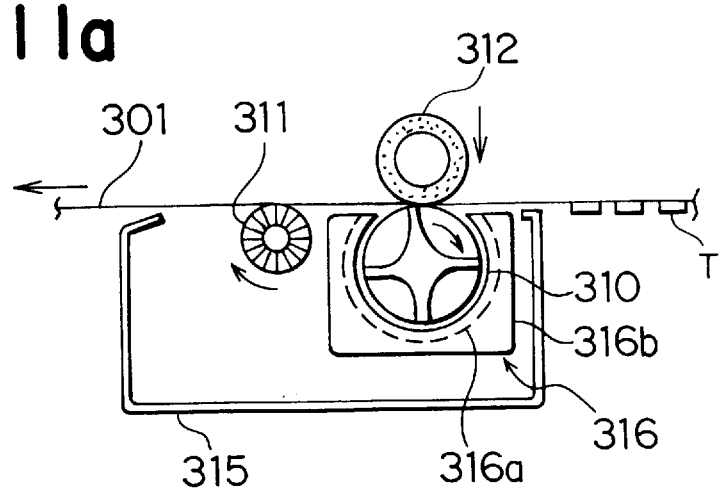
FIG. 11a is a front view showing a schematic construction of one modified example of the cleaner.
Figure 11B:
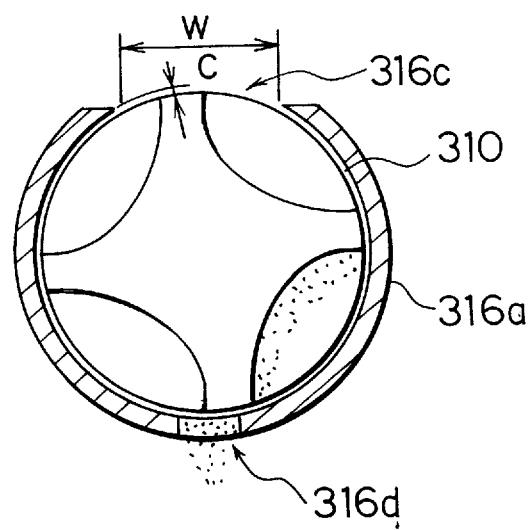

In this embodiment form, there is a case in which toner remains on the offset belt 301 by static electricity since no toner can be completely removed from the offset belt by the above spiral roller 310. Therefore, in this embodiment form, as shown in FIG. 11a, an auxiliary brush roller 311 rotating in a direction reverse to the moving direction of the offset belt 301 is arranged as an auxiliary cleaning means for removing the toner T remaining on the surface of the offset belt 301 passing through a contact portion between the spiral roller 310 and the backup roller 312. Since the auxiliary brush roller 311 is rotated in the direction reverse to the moving direction of the offset belt 301, the remaining toner on the offset belt 301 is removed therefrom and can be collected into a unit case 315 and scattered toner can be stored into the unit case 315. An upper opening of the unit case 315 is closed by the offset belt 301. An unillustrated seal member is attached to end portions of the spiral roller 310 and the auxiliary brush roller 311 in the rotating axis direction.

A brush material of the auxiliary brush roller 311 can be constructed by using polyester 250/24 (density 300 loops/inch), PP170/20 (density 60000 pieces/inch), etc. However, the brush material of the auxiliary brush roller 311 is not limited to these materials, but may be constructed by a material which does not damage the offset belt 301. When a material having an electricity removing function such as a brush material constructed by carbon fibers is used as the brush material of the auxiliary brush roller 311, the remaining toner on the offset belt 301 can be removed from this offset belt while electricity of each of the offset belt 301 and the remaining toner on this offset belt is removed therefrom. Accordingly, cleaning performance of the offset belt 301 can be improved. Generally used stainless steel fibers such as SUS316 (12μm×100 F, density 450 loops/inch) can be also used as the brush material of the auxiliary brush roller 311. In this case, it is sufficient to make the stainless steel fibers come in soft contact with the offset belt 301. Accordingly, there are no fears of an increase in size of a drive motor and cause of noises by increasing a driving load as in a general case in which the stainless steel fibers come in contact with the offset belt 301 with a strong press contact force.

A device for beating down toner attached to the auxiliary cleaning brush 311 is also arranged although this device is not illustrated. Repeating performance of the auxiliary cleaning brush 311 can be improved by this device.

In this embodiment form, a cover for covering the spiral roller 310 is arranged along an outer circumferential face of the spiral roller 310. This cover 316 is constructed by a cylindrical member 316a and a flange member 316b. For example, a material of each of the cylindrical member 316a and the flange member 316b can be constructed by using SUS304. An opening 316c having a width W is formed in the rotating axis direction above the cylindrical member 316a of this cover 316. One portion of the spiral roller 310 is exposed from this opening 316c. The toner T removed by a spiral edge of the spiral roller 310 is conveyed by rotation of the spiral roller 310 toward one end portion thereof on the rotating axis while the toner T is held by a side face of the spiral edge and an inner face of the cylindrical member 316a. A gap C between the inner face of the cylindrical member 316a and an outer circumferential face of the spiral roller 310 is preferably set to be narrow in view of conveyance of the toner T. In this embodiment form, when the gap C is about 0.2 mm, preferable results can be obtained.

An opening 316d for discharging toner is formed along the rotating axis direction in a lower portion of the cylindrical member 316a. Toner conveyed in a constant direction within the cylindrical member 316a is discharged from the opening 316d and drops and is accumulated within the unit case 315. This opening 316d may be formed in an arbitrary shape. For example, plural round holes and elongated holes may be formed as the opening 316d along the rotating axis direction. Otherwise, an elongated opening may be formed in a slit shape along the rotating axis direction. A paper pack is attached onto an inner side of the unit case 315. Accordingly, when the unit cover 315 is filled with toner, it is sufficient to dump the paper pack so that the toner is easily dumped. An end portion of the cylindrical member 316a may be detachably extended in a toner conveying direction instead of the opening 316d. In this case, after a predetermined amount of toner is accumulated within the unit cover 315, this toner is dumped by detaching the extended end portion from the cylindrical member 316a. Further, an opening for discharging toner may be formed in the extended end portion instead of the detachable construction thereof. In this case, this opening is formed in the cover and constitutes a discharging opening in the vicinity of one end portion of the cover to discharge collected toner conveyed to this one end portion by rotating a spiral edge. Namely, this discharging opening is a discharging hole formed near one end portion of the cover in a spiral advancing direction of the spiral edge. In this case, the toner is stored into a collecting tank arranged outside the unit case 315 from the opening of the extended end portion.

In the cleaner constructed above, toner strongly attached to the offset belt 301 is cooled to a temperature equal to or lower than a toner softening temperature by a cooling device 313 in separating processing of the toner. Thereafter, the toner is scraped together with paper powder, paper fibers, etc. attached onto the offset belt 301 by a spiral edge of the spiral roller 310 rotating at a linear velocity higher than that of the offset belt 301. The toner T remaining on the offset belt 301 is removed therefrom by the auxiliary brush roller 311 and is stored into the unit case 315. The toner removed by the above spiral edge is conveyed onto one end portion side of the spiral roller in the rotating axis direction while the toner is guided by the side face of the spiral edge and the inner face of the cover 316 by rotating the spiral roller 310. Such conveyed toner is then discharged into the unit case 315 from the opening formed in the lower portion of the cover 316. The toner within the unit case 315 is dumped together with the paper pack attached onto an inner face of the unit case.

As mentioned above, in this embodiment form, toner, paper powder, paper fibers, etc. strongly attached onto the offset belt 301 are scraped by an edge of the spiral roller 310. Accordingly, damage of the surface of the offset belt 301 is restrained to a wearing extent so that durability of the offset belt 310 can be improved in comparison with a case in which a brush roller comes in press contact with the offset belt and is rotated at a high speed. Further, toner remaining on the surface of the offset belt 310 passing through a contact portion between this offset belt and the spiral roller 310 is removed by the auxiliary cleaning roller 311. Accordingly, the toner attached to the offset belt 301 is reliably removed therefrom and separating performance at a repetitious using time of the offset belt 301 can be maintained.

In the case of the cleaner using the general brush roller, there is a fear of a reduction in durability of a brush material since toner, paper powder, etc. transferred together with this toner are accumulated in the brush material. The brush material of the general brush roller is formed by winding stainless steel fibers around a core bar and adhering the stainless steel fibers to the core bar so that a processing accuracy of the brush material is not so high. Accordingly, there is a fear of generation of cleaning irregularities since the brush material ununiformly comes in contact with a separating member. Further, since the above brush roller comes in contact with the separating member with a strong press contact force, there are fears of an increase in size of a drive motor and cause of noises by increasing a driving load.

In contrast to this, in accordance with this embodiment form, toner, paper powder, paper fibers, etc. can be removed from the offset belt 301 without any fear of disadvantages caused in the case of the above brush roller.

Figure 12:
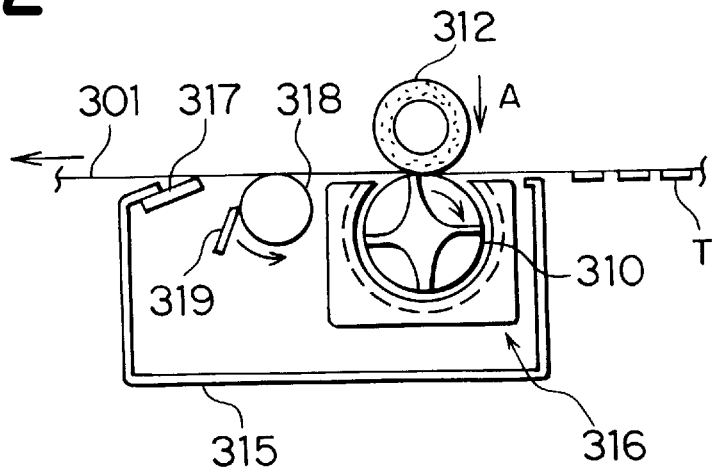
FIG. 12 is a front view showing a schematic construction of another modified example of the cleaner.

In the cleaner in the above embodiment form, the auxiliary brush roller 311 is used as an auxiliary cleaning means. However, as shown in FIG. 12, a blade 317 and an electricity removing roller 318 may be used instead of this auxiliary brush roller 311. In this case, the electricity removing roller 318 is arranged on an upstream side of the blade 317 and removes electricity from the offset belt 301 and toner on this offset belt. When such a blade 317 is used, the auxiliary cleaning means is simply constructed in comparison with a case in which the brush roller 311 is used. Accordingly, cost of the toner removing apparatus can be reduced. Toner, paper powder, etc. attached onto the electricity removing roller 318 are removed therefrom by the blade 319.

In the cleaner in the above embodiment form, the backup roller 312 is used as a backup member. However, as shown in FIG. 13a, a backup member 320 as a rigid body may be used instead of this backup roller 312. This backup member is arranged such that the backup member is opposed to the spiral roller 310 while a clearance slightly narrower than a thickness d of the offset belt 301 is held. When the backup member 320 is thus arranged, only attachment such as toner, etc. on the offset belt 301 is separated and removed therefrom and advance of wearing of the offset belt 301 itself can be restrained. In this construction, toner, etc. unremovable by the spiral roller 310 and remaining on the offset belt 301 are also removed by the auxiliary cleaning means. As shown in FIG. 13b, the offset belt 301 may be pressed against the spiral roller 310 by two rollers 321a and 321b as a backup means in two positions by utilizing flexibility of the offset belt 301. In the case of this construction, a press contact width of the spiral roller 310 with respect to the offset belt 301 can be widened in comparison with the above case in which the single backup roller is used. Accordingly, removing efficiency of toner can be improved and a rotating speed of the spiral roller 310 can be relatively reduced.

Embodiment Form 2

FIG. 14 is a front view showing the schematic construction of a toner separating unit in another embodiment form. In the toner separating unit in this embodiment form, an offset belt 301 is wound around a plurality of supporting rollers 322a to 322d and is arranged such that the offset belt 310 approximately comes in contact with a half of an outer circumferential face of a winding roller 323 having a built-in heater and a large diameter. Three pressurizing rollers 324a to 324c each having a built-in heater come in press contact with the winding roller 323 through the offset belt 301. A transfer paper sheet 1 is fed to a portion between the winding roller 323 and the offset belt 301 coming in contact with the supporting roller 322d in a state in which a toner attaching face of the transfer paper sheet 1 is set to a lower face. While toner on the transfer paper sheet 1 is heated and softened, the toner comes in press contact with the offset belt 301. Thereafter, the transfer paper sheet 1 is separated from the offset belt 301 by using curvature separation using the supporting roller 322a. Thus, the toner on the transfer paper sheet 1 is separated and removed therefrom. The toner T transferred from the transfer paper sheet 1 is cooled and solidified by a cooling device 313. Thereafter, the toner T is removed from the offset belt 301 by a spiral roller 310 and an auxiliary brush roller 311. The offset belt 301 removing the toner therefrom is again used in the toner separating processing.

Embodiment Form 3

FIG. 15 is a front view showing the schematic construction of a toner separating unit in another embodiment form. In the toner separating unit in this embodiment form, an offset belt 328 wound around a plurality of supporting rollers 326a to 326d and an opposite belt 331 wound around a plurality of supporting rollers 329a to 329d come in contact with each other in a conveying path of a transfer paper sheet. In this conveying path of a transfer paper sheet, heating supporting rollers 325a, 325c, 325e, 325g each having a built-in heater on a side of the offset belt 328 and heating supporting rollers 325b, 325d, 325f each having a built-in heater on a side of the opposite belt 331 slightly bite into each other through the offset belt 328 and the opposite belt 331. The transfer paper sheet 1 is conveyed in a zigzag shape in this conveying path of the transfer paper sheet. The offset belt 328 and the opposite belt 331 are respectively tensioned by tension rollers 327a, 327b and tension rollers 330a, 330b. A toner attaching face of the transfer paper sheet 1 is set to a lower face and this transfer paper sheet 1 is fed to an inlet of the transfer paper sheet conveying path in which supporting rollers 326a and 329a are opposed to each other. When the transfer paper sheet is conveyed in a zigzag shape between the heating supporting rollers 325a to 325g, toner T on the transfer paper sheet 1 repeatedly is heated and repeatedly comes in press contact with the offset belt 328 at many stages. Thereafter, the transfer paper sheet 1 is separated from the offset belt 301 by curvature separation using a supporting roller 326d so that the toner on the transfer paper sheet 1 is separated and removed therefrom. The toner T transferred from the transfer paper sheet 1 is cooled and solidified by an unillustrated cooling device. Thereafter, the toner T is removed from the offset belt 328 by a spiral roller 310 and an auxiliary brush roller 311. The offset belt 328 removing the toner therefrom is again used in the toner separating processing.

In the case of this constructional example, the above opposite belt 331 can be also constructed by using an offset belt so as to remove toner from both faces of the transfer paper sheet 1.

Embodiment Form 4

FIG. 16 is a front view showing the schematic construction of a toner separating unit in accordance with another embodiment form. In the toner separating unit in this embodiment form, a cylindrical separating roller 332 is used instead of the above offset belt 301. The toner separating unit has a pressurizing roller 333, a heating lamp 335 and a reflecting plate 336. The pressurizing roller 333 pressurizes a transfer paper sheet 1 to the separating roller 332. The heating lamp 335 and the reflecting plate 336 are arranged as a heating means on a slightly upstream side from a press contact portion between the pressurizing roller 333 and the separating roller 332 in a moving direction of a surface of the separating roller 332. The heating lamp 335 heats a surface portion of the separating roller 332 from its inner side. A spiral roller 310 and an auxiliary brush roller 311 come in direct contact with the surface of the separating roller 332. The transfer paper sheet 1 is fed to a press contact portion between the separating roller 332 and the pressurizing roller 333 in a state in which a toner attaching face of the transfer paper sheet is set to a lower face. While toner on the transfer paper sheet 1 is heated and softened, the toner comes in press contact with the separating roller 332. Thereafter, the transfer paper sheet 1 is separated from the separating roller 332 as an offset belt by an unillustrated separating claw, etc. Thus, the toner on the transfer paper sheet 1 is separated and removed therefrom. The toner T transferred from the transfer paper sheet 1 is cooled and solidified by a cooling device 313. Thereafter, the toner T is removed from the separating roller by the spiral roller 310 and the auxiliary brush roller 311. The separating roller as an offset belt removing the toner therefrom is again used in the toner separating processing.

Embodiment Form 5

FIG. 17a is a front view showing the schematic construction of a toner removing apparatus in accordance with another embodiment form. FIGS. 17b and 17c are respectively an enlarged front view and an enlarged perspective view of a spiral roller and a backup roller used in the toner removing apparatus shown in FIG. 17a. Constructional portions similar to those of the toner removing apparatus in the above embodiment form 1 (shown in FIGS. 3 and 4) are designated by the same reference numerals and have functions similar to those of the constructional portions of the toner removing apparatus in the embodiment form 1. Accordingly, an explanation about constructional portions except for a cleaner is omitted in the following description. However, in a toner separating unit 300 of the toner removing apparatus in this embodiment form, a pressurizing heating roller 360 and a separating roller 361 having a small diameter are used instead of the above heating block 304.

Alphabet marks in FIG. 17b are defined as follows. Ln is a nipping width (supporting width) (mm) of a transfer paper sheet nipped by the spiral roller 310 and the backup roller 312. V1 is a linear velocity (mm/sec) of an offset belt. $V2=\pi D(R/60)$ is a linear velocity (mm/sec) of an outer circumferential face of the spiral roller 310. $L=(\pi D)/H$ is an edge interval (mm) on the outer circumferential face of the spiral roller 310 in its rotating direction. D is an outside diameter (mm) of the spiral roller 310. R is the number of rotations (rpm) of the spiral roller 310. H is the number of spiral edges of the spiral roller.

In FIGS. 17a and 17b, an offset belt 301 is supported between the backup roller 312 rotated in association with the offset belt 301 as a separating member and the spiral roller 310 as a cleaning member having a spiral edge 310a and an independent rotating mechanism. Toner transferred to the offset belt 301 is scraped off by the spiral edge 310a of the rotating spiral roller 310. When the toner is scraped off by the spiral edge 310a of the spiral roller 310, toner is not collected and clogged in an escaping portion except for the spiral edge 310a and drops outside the spiral edge 310a as the spiral roller 310 is rotated.

In contrast to a brush roller having a continuous cleaning function (for example, see Japanese Patent Application Laying Open (KOKAI) No. 3-116083), the spiral roller 310 used in this embodiment form has a cleaning function only in a passing case of the spiral edge 310a and has no cleaning function in a case except for this passing case. Accordingly, when the number of rotations of the spiral roller 310 is unlimitedly increased, toner can be reliably cleaned. However, mechanical noises of the spiral roller 310 as a rotating body are increased as the number of rotations of the spiral roller 310 is increased. A ratio of rasping high frequency components is also increased with respect to frequencies of these noises. Further, the offset belt 301 is cut by an edge of the spiral roller 310 so that durability of the offset belt 301 is greatly reduced. Conversely, when the number of rotations of the spiral roller 310 is reduced to avoid evils caused by increasing the number of rotations of the spiral roller 310, cleaning remainings formed in a stripe shape as shown in FIG. 18 are caused on the offset belt 301. A hatching portion of FIG. 18 shows a remaining region of toner T and an arrow in FIG. 18 shows a moving direction of the offset belt 301.

In this embodiment form, various kinds of conditions are set such that no evils are caused by increasing the number of rotations of the spiral roller 310 and no cleaning remainings formed in the above stripe shape are caused. In FIG. 17b, a passing time of the offset belt 301 passing through the nipping width (supporting width) Ln (mm) at the linear velocity V1 (mm/sec) is shown by Ln/V1 (sec). In contrast to this, when the spiral roller 310 having an edge interval L (mm) in a circumferential direction thereof is rotated at a linear velocity V2 (mm/sec), a moving time of an outer circumferential face of this spiral roller 310 moved by the above edge interval L is L/V2 (sec). A fulfilling time of a cleaning function among this moving time L/V2 (sec) is shown by Ln/V2 (sec). FIG. 19 is a time chart typically representing a portion of the fulfilling time Ln/V2 of the cleaning function in an upwardly convex shape and showing the mutual relation between the above Ln/V1, L/V2 and Ln/V2. As clearly seen from this FIG. 19, when at least the relation of $Ln/V1 \geq L/V2$ is not formed, no surface of the offset belt 301 can be continuously cleaned. Here, the above relation $Ln/V1 \geq L/V2$ can be also represented as $Ln/V1 \geq L/(\pi D(R/60))$ so as to easily understand the relation between Ln and R. In this formula, L and D are determined in design of the spiral roller 310. Ln is determined by a load applied between the spiral roller and the backup roller in a press contact direction, a thickness and hardness of rubber used in the backup roller, and diameters of the respective rollers. R is a process set value.

The above nipping width (supporting width) Ln corresponds to an effective contact width We for really fulfilling the cleaning function and can be measured by the following measuring method I or II. For example, in the measuring method I, a full black toner image is transferred to the offset belt 301. The width of a toner removing portion in a rotating direction of the spiral roller is measured by rotating the spiral roller 310 in a stationary state of the offset belt 301 in a cleaner. This measured value is set to the above nipping width (supporting width) Ln. For example, in the measuring method II, a full black toner image is transferred to the offset belt 301. The width of a toner removing portion in a direction perpendicular to a belt moving direction is measured by moving the offset belt 301 in a stationary state of the spiral roller 310 in the cleaner. This measured value is divided by tan θ a (θ a is a torsion angle) and is set to the above nipping width (supporting width) Ln.

Concrete embodiments of this embodiment form 5 will next be explained.

In a first embodiment of this embodiment form 5, a rubber roller (outside diameter: φ 20 mm, rubber hardness: 21 degrees, rubber thickness: 4 mm) is used as the above backup roller 312. A load 8 kgf (as a total at both axial ends) per width 150 mm is applied to the spiral roller (outside diameter: φ 24 mm, the number of spiral edges: 4, torsion angle θ a: 35 degrees, rake angle θ b: 0°, land width W1: 3 mm) 310 through the offset belt 301. The nipping width (supporting width) Ln corresponding to the above effective contact width We is measured by the above measuring method II. A measured value of the nipping width is averagely 2.13 mm. When a linear velocity of the offset belt 301 is 25 mm/sec and the number of rotations of the spiral roller 310 is 100 rpm, cleaning remainings formed in a stripe shape are caused. However, when the number of rotations of the spiral roller 310 is equal to or greater than 200 rpm, toner can be cleaned by 100%. At this time, when the number of rotations of the spiral roller 310 is 100 rpm, the above Ln/V1=85 msec and L/V2=150 msec are formed so that Ln/V1<L/V2 is formed. In contrast to this, when the number of rotations of the spiral roller 310 is 200 rpm, Ln/V1 is not changed and L/V2=75 msec is formed so that $Ln/V1 \geq L/V2$ is formed. A spiral edge of the spiral roller 310 comes in contact with toner on the offset belt 301 at least one time during a time interval of Ln/V1 so that the toner can be cleaned by 100%.

In a second embodiment in this embodiment form 5, a rubber roller (outside diameter: φ 20 mm, rubber hardness: 20 degrees, rubber thickness: 4 mm) is used as the backup roller 312. A load 8 kgf (as a total at both axial ends) per width 150 mm is applied to the spiral roller (outside diameter: φ 24 mm, the number of spiral edges: 4, torsion angle θ a: 35°, rake angle θ b: 0°, land width W1: 1.5 mm) 310 through the offset belt 301. Toner on the offset belt 301 is then cleaned. When a linear velocity of the offset belt 301 is 25 mm/sec (corresponding to transverse feed 6cpm in size A4), noises are measured by changing the number of rotations of the spiral roller 310. The measured results of the noises are shown in the following Table 1.

TABLE 1

| measuring condition | | |
|---|---|---|
| | the number of rotations of spiral roller (rpm) | measured value of noise level (dB value at distance 0.5 m) |
| background noise | — | 37.7 |
| belt dtive (25 mm/s) | — | 49.3 |
| belt drive (25 mm/s) + cleaning operation | 50 | 51.7 |
| | 80 | 57.4 |
| | 100 | 58.6 |
| | 150 | 60.1 |
| | 200 | 62.2 |
| | 250 | 64.0 |
| | 300 | 64.7 |
| | 320 | 66.0 |
| | 350 | 66.3 |
| | 400 | 67.2 |
| | 450 | 68.0 |

TABLE 1-continued measuring condition

| the number of rotations of spiral roller (rpm) | measured value of noise level (dB value at distance 0.5 m) |
|---|---|
| 500 | 68.8 |
| 550 | 69.4 |
| 600 | 70.0 |
| 650 | 70.6 |
| 700 | 71.1 |
| 750 | 71.5 |

From these results of this Table 1, it should be understood that a noise level tends to be increased as the number of rotations of the spiral roller 310 is increased. It is clearly preferable to set apparatus noises to be smaller in view of a using environment. However, it is important to stabilize the cleaning function and balance the cleaning function and cost relative to this cleaning function. The outside diameter of the spiral roller 310 can be increased if an increase in space for the spiral roller 310 can be allowed. However, a practical outside diameter φ of the spiral roller 310 is 24 mm. It is considered that an office environment is held if the noises of equipments in offices are equal to or smaller than 66 dB. For example, see noise restriction (1995. 7) by Blue Angel in standard of Germany.

Therefore, the above restricted noises of equipments in offices can be set to be equal to or smaller than 66 dB by setting the number of rotations of the spiral roller 310 to be equal to or smaller than 320 rpm on the basis of the above Table 1. Further, in this condition, durability of the offset belt 310 (PEEK (polyether ether ketone resin) material, 100 μm in thickness) corresponds to 190000 sheets in processed paper sheet conversion so that a long life of the offset belt 310 can be secured in comparison with the other mechanical parts.

In the toner removing apparatus in the above embodiment form 5, the number of rotations of the spiral roller 310 capable of obtaining a similar cleaning performance can be reduced if the above nipping width (supporting width) Ln is set to be wide, or the clearance L of the edge 310b of the spiral roller 310 is reduced. However, in this case, when a pressure applied to a supporting portion between the spiral roller 310 and the backup roller 312 is set to be constant, it is necessary to apply a large load to the supporting portion.

Therefore, the cleaner may be constructed by a plurality of spiral rollers so as not to increase the above load. In this case, transfer toner on the offset belt 310 is cleaned 100% by controlling mutual rotating timings of the spiral rollers when the spiral rollers are rotated. For example, three spiral rollers are attached such that relative positions of respective spiral edges with respect to a belt moving face are equal to each other. Further, as shown in FIG. 20, operations of the spiral rollers are controlled such that rotating start timings of the respective spiral rollers are shifted from each other in consideration of distances between the respective spiral rollers. The cleaning remaining portion caused in toner scraping-off of a first spiral roller is scraped off by the next second and third spiral rollers. Thus, the toner on the offset belt 301 is removed therefrom by sharing of the plural spiral rollers. Accordingly, the transfer toner on the offset belt 301 can be cleaned 100% without increasing the number of rotations of the spiral roller and increasing the above load to widen the above nipping width (supporting width). In the above concrete example, the operations of the spiral rollers are controlled such that the rotating start timings of the respective spiral rollers are shifted from each other. However, the respective spiral rollers may be attached by setting relative positions of spiral edges of the respective spiral rollers with respect to the belt moving face to be in conformity with each other such that rotations of the respective spiral rollers are simultaneously started and the toner on the offset belt 301 is removed therefrom by sharing of the spiral rollers.

In the toner removing apparatus in the above embodiment form 5, there is a fear of generation of damage of an end portion of the backup roller 312 in its axial direction. For example, the backup roller 312 is constructed by using a rubber roller (outside diameter: φ 36 mm, rubber hardness: JISA 80 degrees, rubber thickness: 1 mm). A load 8 kgf (a total at both axial ends) per width 150 mm is applied to a spiral roller (outside diameter: φ 60 mm, the number of spiral edges: 12, torsion angle θ a: 30°, rake angle θ b: 5°, land width W1: 1 mm) through the offset belt 301. In this case, the rubber roller is shaved in an uncontact portion of the rubber roller which does not come in contact with the offset belt. To prevent this shaving, an outer circumferential face of the spiral roller 310 opposed to this uncontact portion of the rubber roller is set to a mirror face (unprocessed) state in which no spiral edge is formed. In this case, driving torque of the spiral roller 310 is increased, and an alarm is given and rotation of the spiral roller is stopped even when a driving source (motor) having large torque (48 kgf cm) is used. It is considered that the driving torque is increased since a surface of the backup roller 312 and the spiral edge of the spiral roller 310 at different linear velocities come in contact with each other.

Therefore, a biting amount of the spiral roller 310 into the backup roller 312 without interposing the offset belt 301 is preferably set to be equal to or smaller than the thickness of the offset belt 301 so as to prevent shaving of the backup roller 312 and the increase in the driving torque. For example, the backup roller 312 is constructed by using a rubber roller (outside diameter: φ 36 mm, rubber hardness: JISA 80 degrees, rubber thickness: 1 mm). A load 4 kgf (a total at both axial ends) per width 150 mm is applied to a spiral roller (outside diameter: φ 60 mm, the number of spiral edges: 12, torsion angle θ a: 30°, rake angle θ b: 5°, land width W1: 1 mm) through the offset belt 301. In this case, the nipping width (supporting width) Ln is averagely 1.9 mm in the above measuring method I. At this time, the number of rotations of the spiral roller 310 is set to a condition for satisfying Ln/V1≧L/V2, and the cleaning operation is performed. In this case, no backup roller (rubber roller) 312 is shaved and no driving torque is increased. At this time, the biting amount of the spiral roller 310 into the backup roller (rubber roller) 312 without interposing the above offset belt 301 is 25 μm and the thickness of the offset belt 301 used at this time is 100 μm. Therefore, a gap g=100−25=75 μm between the spiral roller 310 and the backup roller (rubber roller) 312 at the interposing time of the offset belt 301 is provided as shown in FIG. 21 so that both the rollers do not come in contact with each other. In FIG. 21, Le is the width of a spiral edge forming portion on an outer circumferential face of the spiral roller. The above biting amount 1 is calculated by the following formula of number 1.

$$1 = r - \sqrt{r^2 - (Ln/2)^2}$$

In the formula of number 1, r is a radius of the backup roller (rubber roller) 312 and Ln is a nipping width (supporting width).

In the above construction, the above biting amount is set to be equal to or smaller than a predetermined amount so as to prevent shaving of the backup roller 312 and the increase in the above driving torque. Instead of this construction or in addition to this construction, the length of a supporting portion in the rotating axis direction between the spiral roller 310 and the backup roller 312 may be set to be equal to or smaller than the width Le of the spiral edge forming portion of the spiral roller 310. For example, as shown in FIG. 22a, the length Lg of a rubber winding portion of the backup roller 312 in the rotating axis direction is set to be shorter than a width of the offset belt 301 with respect to only a portion required to be cleaned by a spiral edge of the spiral roller 310. At this time, a measured value of the nipping width (supporting width) Ln of a pressing portion through the offset belt 301 is averagely 4.2 mm in the above measuring method I. Further, the biting amount of the spiral roller 310 into the backup roller (rubber roller) 312 is 125 μm.

Similar effects can be also obtained when a portion of the spiral roller 310 except for its portion required for cleaning is shaved as shown in FIG. 22b instead of removal of a portion of the backup roller (rubber roller) 312 except for its portion required for cleaning. In each of these cases, the cleaning operation is stably performed if a shaving amount of the spiral roller 310 is equal to or greater than the above biting amount.

Embodiment Form 6

FIG. 23a is a front view showing the schematic construction of a toner removing apparatus in accordance with another embodiment form. FIG. 23b is an enlarged front view of a spiral roller and a backup roller used in the toner removing apparatus shown in FIG. 23a. Constructional portions similar to those of the toner removing apparatus in each of the above embodiment forms 1 and 5 (in FIGS. 3 and 4 and FIGS. 17a to 17c) are designated by the same reference numerals and have similar functions. Accordingly, an explanation about constructional portions except for a cleaner is omitted in the following description.

In the cleaner in this embodiment form 6, a backup belt 352 is wound around two backup rollers 350 and 351 rotated in association with an offset belt 301. A spiral roller 310 has an independent rotating mechanism. The offset belt 301 is supported between the backup rollers 350, 351 and the spiral roller 310 through the backup belt 352. Toner transferred to the offset belt 301 is scraped off by a rotating spiral edge.

In one embodiment of this embodiment form 6, the backup belt 352 is wound around the two backup rollers each having an outside diameter φ 20 mm. A load F1 is applied to each of shafts of the two backup rollers from above. Otherwise, one of the backup rollers is fixed and a tension load F2 is applied to the other backup roller. At this time, a load per unit area applied to the entire area of a nipping width (supporting width) Ln is averagely set to about 1.5 kgf/cm$^2$ (in a range from 1.0 to 3.0 kgf/cm$^2$). Here, the nipping width (supporting width) Ln=25 mm, and the above V1=25 mm/sec are set. With respect to the spiral roller 310, outside diameter φ is 60 mm, the number of spiral edges 24, torsion angle θ a 30°, rake angle θ b 0° and land width W1 is 1 mm. When the number of rotations of the spiral roller 310 is 6 rpm and toner is cleaned, Ln/V1=1 sec and L/V2=417 msec are formed so that Ln/V1≧L/V2 is formed and this toner can be cleaned 100%. At this time, V2=19 mm/sec is set so that the toner can be cleaned even when V1<<V2 is not necessarily formed.

The conditional formula Ln/V1≧L/V2 shown in each of the above embodiment forms 5 and 6 can be also applied to a cleaning roller (a rotating type cutter) having an edge formed in parallel with a rotating axis shown in Japanese patent application No. 6-324601 of this patent applicant in addition to the case of the above spiral roller 310. In this case, effects similar to the above effects can be obtained.

As mentioned above, in the present invention, a cleaning member is formed in a roller shape and has a spiral edge coming in contact with the surface of a separating member in an outer circumferential portion of the cleaning member. An image forming substance strongly attached onto the separating member is scraped off by rotating the cleaning member by a driving means and making the edge of the cleaning member come in contact with this image forming substance. Accordingly, the image forming substance can be scraped off and removed from the separating member even when the cleaning member is rotated at a lower rotating speed in comparison with a case in which a brush roller strongly comes in press contact with the image forming substance and is rotated at a high speed. Further, damage of the separating member surface is restrained to a wearing extent so that durability of the separating member can be improved.

When the brush roller is used, the image forming substance removed from the separating member is attached to a brush and the brush is clogged. However, no clogging is caused in the present invention so that cleaning performance can be stably maintained.

In particular, in the present invention, no image forming substance attached onto the separating member remains in removing processing by making this image forming substance come in contact with the edge of the above cleaning member at least one time. Accordingly, the image forming substance attached to the separating member is more reliably removed therefrom and separating performance of the separating member at its repetitious using time can be maintained.

In particular, in the present invention, the image forming substance remaining on the surface of the separating member passing through a contact portion between the separating member and the above cleaning member is removed therefrom by an auxiliary cleaning means. Accordingly, the image forming substance attached to the separating member is more reliably removed therefrom and separating performance of the separating member at its repetitious using time can be maintained.

In particular, in the present invention, electricity of the separating member passing through the above contact portion of the cleaning member and electricity of the image forming substance remaining on the surface of the separating member are removed therefrom by the auxiliary cleaning means having an electricity removing function. Therefore, the image forming substance can be removed from the separating member by the above auxiliary cleaning means while or after electrostatic adhesive force of the image forming substance remaining on the separating member is weakened to easily remove the image forming substance from the separating member. Accordingly, the image forming substance attached to the separating member can be more reliably removed therefrom.

In particular, in the present invention, the image forming substance scraped by the spiral edge of the above cleaning member is conveyed toward one end portion of the cleaning member in a rotating axis direction thereof while this image forming substance is held on a side face of the spiral edge and the inside face of a cover arranged along an outer circumferential face of the cleaning member. Accordingly, the image forming substance removed by the cleaning member can be collected in this end portion and can be discharged.

In particular, in the present invention, the image forming substance on the separating member to be removed by the above cleaning member is cooled by a cooling means. Therefore, the image forming substance softened by heating of a softening means is solidified so that the image forming substance on the separating member is easily removed therefrom by the cleaning member. Accordingly, the image forming substance attached onto the separating member can be more reliably removed therefrom.

The following explanation relates to an embodiment of the present invention in which the present invention is applied to an image forming substance removing apparatus for removing thermally softened toner for an electrophotograph as an image forming substance from a sheet of transfer paper as an image holding member forming an image thereon by an electrophotographic copying machine of a transfer type. In the following description, the thermally softened toner is simply called toner.

Figure 1:
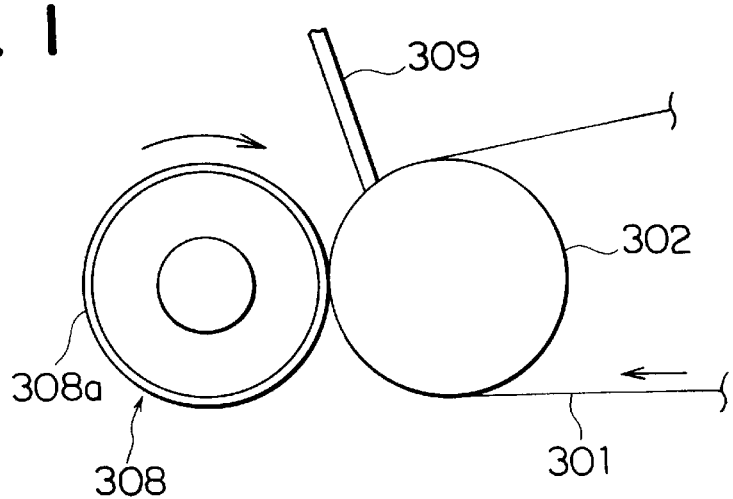
FIG. 1 is a front view showing the schematic construction of a cleaner in a general example.
Figure 2:
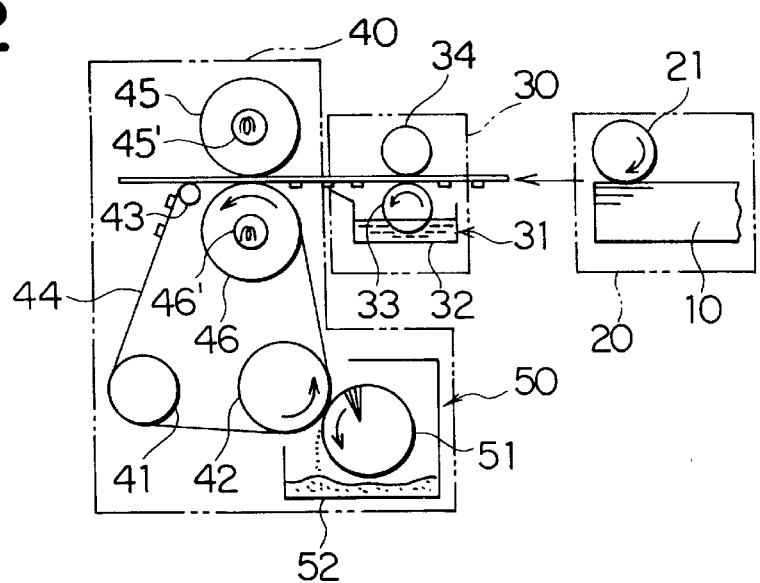
FIG. 2 is a front view showing the schematic construction of a generally proposed image forming substance removing apparatus for removing an image forming substance from an image holding member.

In the image forming substance removing apparatus in this embodiment, a belt cleaning section 50 shown in FIG. 24 is used instead of the belt cleaning section 50 in the image forming substance removing apparatus shown in FIG. 2.

In a paper feed unit 20 shown in FIG. 2, transfer paper sheets 10 are stacked on a paper feed base 21 in a state in which a toner image face of each of the transfer paper sheets is set to a lower face. The transfer paper sheets 10 are fed from an uppermost sheet by a paper feed roller 21 so that only one transfer paper sheet 10 is sequentially fed. Concrete construction and operation of the paper feed unit 20 are similar to those of a paper feed mechanism in the electrophotographic copying machine. Accordingly, a detailed explanation of this paper feed unit 20 is omitted in the following description.

A separating liquid supplying unit 30 supplies a liquid 31 such as water or an aqueous solution including a surfactant, etc. to the transfer paper sheet 10 so as to improve permeability with respect to the transfer paper sheet 10. In FIG. 2, the separating liquid supplying unit 30 has a liquid container 32 for storing the liquid, a coating roller 33 and a restricting roller 34. The coating roller 33 is arranged such that the coating roller 33 is partially dipped into the liquid of the liquid container 32. The liquid is drawn up by rotating the coating roller 33 and is supplied to the toner image face of the transfer paper sheet 10. The restricting roller 34 as a paper restricting member is arranged such that the restricting roller 34 is opposed to the coating roller 33 through a paper conveying path. The coating roller 33 can be constructed by using a roller formed by a material having a liquid holding property such as a hydrophilic porous material, a sponge, etc., an elastic material such as rubber or a rigid body such as a metal, etc.

A toner separating unit 40 has a separating belt 44, a heating roller 45, a backup member 46 and a belt cleaning section 50. The separating belt 44 as a separating material is wound around a plurality of belt supporting rollers such as three belt supporting rollers 41, 42 and 43. The heating roller 45 is arranged such that the heating roller 45 and the backup member 46 come in press contact with each other through the separating belt 44. A heating lamp 45' is built in the heating roller 45. A heating lamp 46' is built in the backup member 46. The belt cleaning section 50 removes toner from a surface of the separating belt 44. At least the surface of this separating belt 44 is formed by a material having adhesive force to softened toner stronger than adhesive force between a surface of the transfer paper sheet 10 and the softened toner. For example, the separating belt itself is formed by a metallic material such as aluminum, copper, nickel, etc., or a polymer material such as polyethylene terephthalate (PET) having a diffused titanium oxide, etc.

A separating belt portion is wound around the supporting roller 43 among the supporting rollers for supporting the separating belt 44 after this separating belt portion passes through a pressurizing portion for pressurizing the transfer paper sheet 10 by the heating roller 45 and the backup member 46. In the following description, the supporting roller 43 is called a separating roller. The separating roller 43 separates the transfer paper sheet 10 from the separating belt 44 by using curvature by suddenly changing a moving direction of the separating belt 44 around the separating roller 43. The separating belt 44 is moved by the supporting roller 41 such that a surface of the separating belt 44 is endlessly moved. In the following description, the supporting roller 41 is called a belt driving roller.

The above heating roller 45 and the backup member 46 make the toner image face of the transfer paper sheet 10 come in close contact with the separating belt 44 and heat and soften toner fixed to the transfer paper sheet 10.

The above belt cleaning section 50 removes toner from a belt circumferential face and stores this toner into a toner collecting container 52.

In this embodiment, this belt cleaning section 50 is constructed as shown in FIG. 24. The belt cleaning section 50 will be described in detail later.

In the above construction, a separating liquid is uniformly supplied by the separating liquid supplying unit 30 to the toner image face of a transfer paper sheet 10 fed from the paper feed unit 20. The transfer paper sheet 10 is then fed to the toner separating unit 40. In this toner separating unit 40, toner fixed to the transfer paper sheet 10 is softened by heating from the heating roller 45 and the backup member 46 and is attached onto a surface of the separating belt 44. When the transfer paper sheet 10 is separated from the separating belt 44 around the separating roller 43, the toner attached onto the surface of the separating belt 44 is separated from the transfer paper sheet 10. Thus, the toner is removed from the transfer paper sheet 10. The transfer paper sheet 10 removing the toner therefrom is dried by a drying unit and is discharged to a paper receiving unit.

In accordance with the above construction, the toner is separated from the transfer paper sheet 10 in a state in which the liquid is supplied to the transfer paper sheet 10 attaching the toner thereto and permeates an interfacial portion between the transfer paper sheet 10 and the toner. Accordingly, the toner can be removed from the transfer paper sheet without damaging paper fibers.

A constructional example of the belt cleaning section 50 relative to this embodiment of the present invention and capable of preferably cleaning the separating belt 44 will next be explained with reference to FIG. 24.

FIG. 24 shows a main portion of the image forming substance removing apparatus in this embodiment of the present invention. The belt cleaning section 50 in this embodiment has a cutter roller 53, a transfer roller 54, a fixing edge 55, a cleaning blade 56 and a toner collecting container 52. The cutter roller 53 is arranged as a rubbing cleaning member constructed by a plurality of rotating edges. The transfer roller 54 is arranged as a separating cleaning member in which a heater 58 is built. The fixing edge 55 and the cleaning blade 56 are arranged as a member constituting a separating cleaning member regenerating means for removing toner T from the transfer roller 54. The toner collecting container 54 surrounds the belt cleaning section 50 and toner powder removed from the separating belt 44 is stored into this toner collecting container 54.

The cutter roller 53 has a rotating shaft in its longitudinal direction. The shaft of the cutter roller 53 is formed in a shape in which four rotating edges extend in a radiating shape in transverse section. An end tip of each of the rotating edges comes in contact with a toner image face of the separating belt 44 between the belt driving roller 41 and the belt supporting roller 42. A backup roller 57 is formed by a soft member and is arranged in a position coming in contact with the cutter roller 53 through the separating belt 44.

A surface material of the transfer roller 54 is constructed by a material having toner adhesive force stronger than that of a surface of the separating belt 44. Namely, the surface of the transfer roller 54 has adhesive force stronger than that of the separating belt 44 as a separating member with respect to toner as an image forming substance. For example, when the separating belt 44 is constructed by PET, the surface of the transfer roller 54 can be formed by using synthetic resin such as PC, PPS, PEEK, PI, etc., or a metal such as SUS, AL, etc.

A swinging arm 59 formed in a planar shape is swingably arranged within the toner collecting container 52 by supporting one end of the swinging arm 59 by a pin 60. A transfer roller 54 is rotatably supported by this swinging arm 59. A fixing edge 55 is fixed to this swinging arm 59 such that an end tip portion of the fixing edge 55 comes in contact with a surface of the transfer roller 54 on its upstream side in a rotating direction of the transfer roller 54. A cleaning blade 56 is fixed to the swinging arm 59 such that an end tip of an elastic member comes in press contact with the surface of the transfer roller 54 on its downstream side.

One end of a spring 61 as a press contact member is fixed into the toner removing apparatus. The other end of the spring 61 is attached to an end portion of the swinging arm 59 on its side which is not supported by the pin 60. The transfer roller 54 comes in press contact with the belt supporting roller 42 through the separating belt 44 by this spring 61 so that a nipping portion P is formed between the transfer roller 54 and the separating belt 44.

In the above construction, the surface of the transfer roller 54 is moved in association with the surface of the separating belt 44 in the nipping portion P.

A cleaning process of a toner image attached onto the separating belt 44 will next be explained.

First, a toner image face of the separating belt 44 reaches a contact position between the cutter roller 53 and the separating belt 44. Here, a rotating edge of the cutter roller 53 is rotated at a high speed in a direction reverse to a conveying direction of the separating belt 44 in a contact portion between the cutter roller 53 and the separating belt 44. An upper portion of the toner image is scraped off from the separating belt 44. Thus, paper powder, paper fibers, separating liquid compositions, etc. attached to the upper portion of the toner image are removed therefrom and height of the image of toner T on the separating belt 44 is uniformed.

The image of toner T processed above by the cutter roller 53 is conveyed to the nipping portion P between the transfer roller 54 and the separating belt 44.

Here, a surface temperature of the transfer roller 54 in the nipping portion P is controlled by controlling a temperature of the internal heater 58 by an unillustrated temperature control means such that the surface temperature of the transfer roller 54 is equal to or higher than a softening temperature of toner T and is equal to or lower than a melting temperature of toner T and is equal to or lower than a heat resisting temperature of each of the separating belt 44 and the transfer roller 54.

The image face of toner T on the separating belt 44 comes in contact with the transfer roller 54 in the nipping portion P for a predetermined time. Thus, the toner T is softened at the above temperature and a predetermined pressure is applied to the toner T so that the toner T is transferred from the separating belt 44 to the surface of the transfer roller 54 having toner adhesive force stronger than that of the separating belt 44.

After the softened toner T transferred to the transfer roller 54 passes through the nipping portion P, the toner T is conveyed to a contact position between the transfer roller 54 and the fixing edge 55 by rotating the transfer roller 54. The toner T then comes in contact with an end tip of the fixing edge 55 so that a large part of the toner T is scraped off from the surface of the transfer roller 54. Further, the toner T remaining on the transfer roller 54 is conveyed to a press contact position between the cleaning blade 56 and the transfer roller 54. Thus, the toner T comes in press contact with an end tip of the cleaning blade 56 so that the toner T is completely removed from the transfer roller 54.

In the above construction, the separating belt 44 is cleaned at two stages by using the cutter roller 53 and the transfer roller 54. In accordance with this construction, the height of the toner T attached onto the surface of the separating belt 44 is uniformed by the cutter roller 53. Further, it is possible to increase a close toner contact degree of the transfer roller 54 having strong adhesive force with respect to the toner T on the separating belt 44. Accordingly, cleaning efficiency of the separating belt 44 using the transfer roller 54 can be preferably improved so that the toner T on the separating belt 44 can be preferably removed therefrom.

When the image of toner T is attached from the transfer paper sheet 10 to the surface of the separating belt 44 with strong adhesive force, paper powder, paper fibers, separating liquid compositions, etc. attached to the toner T can be removed therefrom by the cutter roller 53. Accordingly, the strong adhesive force of the transfer roller 54 can be applied to the toner T so that the toner T on the separating belt 44 can be reliably removed from therefrom by the transfer roller 54 without remaining this toner T on the separating belt 44.

In particular, the separating belt 44 can be preferably cleaned even when weak paper fibers of the transfer paper sheet 10 reducing the cleaning efficiency of the separating belt 44 in toner removing processing tend to be attached to the separating belt 44. Accordingly, the toner removing processing can be preferably performed irrespective of a paper quality of the transfer paper sheet 10.

Further, wearing of the separating belt 44 is reduced and life of the separating belt 44 can be extended in comparison with a method in which a hard brush is strongly pressed against the separating belt 44 and toner T is scraped off from the separating belt 44.

In the above construction, the separating belt 44 is cleaned at two stages at which the cutter roller 53 composed of cutter edges is rotated in press contact with the separating belt 44 and toner T remaining on the separating belt 44 is then separated therefrom by the transfer roller 54. Accordingly, a toner removal requiring amount of the cutter roller 53 required to remove the toner T by this cutter roller is small in comparison with the general case in which the toner on the separating belt 44 is cleaned by only a rotating brush roller. Therefore, a degree of freedom in setting of each of a shape, a material, a rotating speed, etc. of the cutter roller 53 is increased. The shape of the cutter roller 53, etc. can be constructed such that no toner scraped off from the separating belt 44 is easily scattered in comparison with the case in which the toner is removed by only the rotating brush roller having a brush shape in an end tip portion thereof. Further, driving force of the cutter roller 53 can be relatively reduced so that a driving system of a motor, etc. can be made compact and cost of the toner removing apparatus can be thereby reduced.

The cutter roller 53 can be precisely manufactured in comparison with the rotating brush roller. Therefore, a contact pressure between the cutter roller 53 and the separating belt 44 can be relatively uniformed when the cutter roller 53 is rotated in contact with the separating belt 44. Accordingly, noises caused by irregular contact between the cutter roller 53 and the separating belt 44 can be reduced.

The above three members composed of the transfer roller 54, the fixing edge 55 as a regenerating member of the transfer roller 54, and the cleaning blade 56 are attached to the swinging arm 59 and are positioned. Accordingly, it is possible to maintain a position accuracy in the relation of the transfer roller 54, the fixing edge 55 and the cleaning blade 56. Further, the transfer roller 54 can be precisely regenerated. Accordingly, toner attaching force of the transfer roller 54 can be maintained and toner removing processing can be performed exactly and strongly.

A construction for further efficiently cleaning the image of toner T on the separating belt 44 will next be explained. In this construction, at least one surface of the transfer roller 54 and the belt supporting roller 42 coming in press contact with the transfer roller 54 through the separating belt 44 is formed by a material having elasticity. When the separating belt 44 and the transfer roller 54 come in contact with each other with a desirable pressure, both the rollers come in press contact with each other such that the nipping portion P has a desirable length.

In the above construction, the image of toner T can be exactly transferred from the separating belt 44 at a lower heating temperature of the transfer roller 54 so that cleaning efficiency of the separating belt 44 can be increased.

In the above image forming substance removing apparatus for removing the image forming substance from the image holding member, an endless belt is used as the separating belt 44, but a roller or a drum-shaped member may be used as the separating belt 44. The transfer roller 54 is formed in a roller shape, but may be constructed by using an endless belt shape.

Further, the transfer roller 54 is constructed such that the transfer roller 54 comes in press contact with the separating belt 44 and is rotated in association with the separating belt 44. However, the transfer roller 54 may be rotated at a high or low speed with respect to the separating belt 44 by applying driving force to the transfer roller 54.

As mentioned above, in accordance with an image forming substance removing apparatus of the present invention, a substance attached onto the surface of an image forming substance and preventing an adhesive property between the image forming substance and a separating cleaning member is removed from this surface by a rubbing cleaning member. Thereafter, the image forming substance remaining on the surface of a separating member is removed therefrom by the separating cleaning member. Accordingly, strong adhesive force can be applied to the image forming substance by the separating cleaning member so that the image forming substance remaining on the surface of the separating member can be reliably removed therefrom.

When the image forming substance attached to the surface of the separating member has an irregular height, the rubbing cleaning member uniforms the surface of the image forming substance and increases a close contact property between the image forming substance and the separating cleaning member. Thereafter, the separating cleaning member comes in close contact with the image forming substance and the image forming substance remaining on the surface of the separating member is removed therefrom. Therefore, the image forming substance remaining on the surface of the separating member can be reliably removed therefrom.

Accordingly, the image forming substance can be exactly removed from an image holding member irrespective of a material of the image holding member and an attaching state of the image forming substance on the image holding member.

In the image forming substance removing apparatus, a position accuracy in the relation of the separating cleaning member and a regenerating member of the separating cleaning member is maintained by a supporting member having the separating cleaning member and the regenerating member of the separating cleaning member. The separating cleaning member is precisely regenerated. Accordingly, adhesive force of the separating cleaning member with respect to the image forming substance can be maintained so that the image forming substance can be removed exactly and strongly.

In the image forming substance removing apparatus, a press contact portion between the separating cleaning member and a supporting member is formed such that this press contact portion has a predetermined length. Thus, a contact time of the separating cleaning member coming in contact with the image forming substance on the surface of the separating member is secured to a certain extent. Accordingly, separating efficiency of the separating cleaning member is increased and the image forming substance can be removed exactly and strongly even when the heating temperature of a transfer member is low.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image forming substance removing apparatus for removing an image forming substance from an image holding member and comprising:

a separating device for separating the image forming substance from the image holding member by separating a separating member having adhesive force stronger than adhesive force between the image holding member and the image forming substance attached onto this image holding member from the image forming substance on the image holding member after this separating member comes in contact with the image forming substance on the image holding member; and a cleaner for cleaning the separating member by removing the image forming substance attached onto the separating member therefrom;

said cleaner comprising:

a cleaning member formed in a roller shape and having an edge-shaped member which comes in contact with a surface of said separating member and is formed in an outer circumferential portion of the cleaning member; and driving means for rotating the cleaning member such that the image forming substance on said separating member comes in contact with said edge-shaped member of said cleaning member at least one time.

2. An image forming substance removing apparatus as claimed in claim 1, wherein said cleaner further comprises auxiliary cleaning means arranged on a downstream side of said cleaning member in a driving direction of said separating member.

3. An image forming substance removing apparatus as claimed in claim 2, wherein said auxiliary cleaning means has an electricity removing function.

4. An image forming substance removing apparatus as claimed in claim 2, wherein said auxiliary cleaning means is constructed by a brush roller.

5. An image forming substance removing apparatus as claimed in claim 2, wherein said auxiliary cleaning means is constructed by a transfer roller for separating the image forming substance from the surface of the separating member by separating the transfer roller from the separating member after the transfer roller comes in contact with the image forming substance on said separating member passing through a contact portion between the separating member and said cleaning member.

6. An image forming substance removing apparatus as claimed in claim 5, wherein the image forming substance removing apparatus further comprises heating means for heating a surface of said transfer roller to a temperature which is equal to or higher than a softening temperature of the image forming substance and is equal to or lower than a melting temperature of the image forming substance.

7. An image forming substance removing apparatus as claimed in claim 5, wherein a surface of said transfer roller has adhesive force stronger than that of said separating member with respect to the image forming substance.

8. An image forming substance removing apparatus as claimed in claim 2, wherein said auxiliary cleaning means is swingably arranged.

9. An image forming substance removing apparatus as claimed in claim 1, wherein the cleaning member is rotated at a linear velocity higher than that of said separating member such that the image forming substance on said separating member comes in contact with the edge-shaped member of said cleaning member at least one time.

10. An image forming substance removing apparatus as claimed in claim 9, wherein said cleaning member is rotated in a direction reverse to a moving direction of said separating member.

11. An image forming substance removing apparatus as claimed in claim 1, wherein a cover for covering the cleaning member is arranged along an outer circumferential face of the cleaning member.

12. An image forming substance removing apparatus as claimed in claim 11, wherein said cover has an opening portion in a contact position of said cleaning member coming in contact with said separating member such that said cleaning member can come in contact with said separating member.

13. An image forming substance removing apparatus as claimed in claim 11, wherein said cover has an opening for discharging collected image forming substance and formed in a lower portion of the cover.

14. An image forming substance removing apparatus as claimed in claim 1, wherein the image forming substance removing apparatus further comprises:

softening means for heating and softening the image forming substance on the image holding member coming in contact with said separating member; and cooling means for cooling the image forming substance on the separating member to be removed by said cleaning member.

15. An image substance removing apparatus as claimed in claim 14, wherein said cooling means cools the image forming substance on the separating member to be removed by said cleaning member to a temperature equal to or lower than a softening temperature of the image forming substance.

16. An image forming substance removing apparatus as claimed in claim 1, wherein said cleaning member has a rotating axis in its longitudinal direction and has a shape in which a plurality of edges extend in a radiating shape in transverse section.

17. An image forming substance removing apparatus as claimed in claim 1, wherein said edge-shaped member of said cleaning member is formed in a spiral shape with a rotating shaft of the cleaning member as a center.

18. An image forming substance removing apparatus as claimed in claim 17, wherein a cover for covering the cleaning member is arranged along an outer circumferential face of said cleaning member;

the cover has an opening portion in a contact position of said cleaning member coming in contact with said separating member such that said cleaning member can come in contact with said separating member; and the cover also has an opening in the vicinity of one end portion of the cover to discharge collected image forming substance conveyed to this one end portion by rotating said spiral edge-shaped member.

19. An image forming substance removing apparatus as claimed in claim 1, wherein said cleaning member has a pressurizing member in an opposite position through said separating member so as to make the cleaning member come in press contact with said separating member.

20. An image forming substance removing apparatus as claimed in claim 19, wherein a biting amount of said cleaning member into the pressurizing member is set to be smaller than a thickness of the separating member in a state in which no separating member is interposed.

21. An image forming substance removing apparatus as claimed in claim 20, wherein at least a surface of said pressurizing member is formed by a soft material.

22. An image forming substance removing apparatus as claimed in claim 1, wherein a length of said edge-shaped member is set to be equal to or shorter than an effective width of said separating member in a rotating axis direction of the cleaning member.

23. An image forming substance removing apparatus as claimed in claim 1, wherein said cleaning member is arranged in a position in which a temperature of the image forming substance on the separating member to be removed is equal to or lower than a softening temperature of the image forming substance.

24. An apparatus for removing an image forming substance from an image holding member, comprising:

a heating member that produces heat which softens the image forming substance on the image holding member when said image forming substance is exposed to said heat;

a separating member having a surface, said separating member being movably positioned to bring said surface into contact with said image forming substance while exposed to said heat, said surface of said separating member adhering to said image forming substance so as to remove said image forming substance from said image holding member while said image forming substance remains in a softened state;

a drive member that moves said separating member along a predetermined path, said image forming substance being conveyed on said surface of said separating member after being removed from said image holding member; and a cleaning mechanism being positioned downstream, along said predetermined path, of where said image forming substance is removed from said image holding member, said cleaning mechanism positioned to contact said surface of said separating member, said image forming substance having been cooled and solidified prior to being cleaned from said surface by said cleaning mechanism, wherein said cleaning mechanism comprises a rotatable spiral roller having a peripheral edge that contacts said surface, said surface and said peripheral edge moving with respect to one another at a predetermined non-zero relative speed so that said peripheral edge removes at least a portion of said image forming substance from said surface.

25. The apparatus of claim 24, wherein said cleaning mechanism further comprises an auxiliary cleaning member comprising at least one of a rotatable brush roller and an electricity removing roller rotatably disposed against said surface of said separating member.

26. The apparatus of claim 25, wherein said auxiliary cleaning member is disposed downstream of said rotatable spiral roller, where downstream is in reference to a moving direction of said surface of said separating member.

27. The apparatus of claim 25, further comprising a cooling fan positioned to blow air against said image forming substance on said surface of said separating member so as to cool and solidify said image forming substance on said surface of said separating member, said cooling fan being positioned downstream of where said separating member initially contacts said image forming substance and upstream of said cleaning mechanism, where downstream is in reference to a moving direction of said surface of said separating member and upstream is in reference to the moving direction of said surface of said separating member.

28. The apparatus of claim 27, wherein said cooling fan comprises a cooling nozzle that directs an air flow toward said separating member.

29. The apparatus of claim 24, wherein:
said separating member comprises an offset belt suspended about a plurality of rotatable rollers; and
said heating member comprises at least one of a heating block and a heating roller that also supports said offset belt, heat from said heating member causing said image forming substance to soften prior to being transferred to said separating member.

30. The apparatus of claim 29, wherein said plurality of rotatable rollers comprises a backup mechanism positioned opposite to said spiral roller such that said offset belt passes between said spiral roller and said backup mechanism, said backup mechanism comprising at least one of a backup roller, a backup member, and a backup belt suspended on a pair of backup rollers positioned at separate locations about an outer periphery of said spiral roller.

31. The apparatus of claim 24, wherein said spiral roller comprises at least one spiral edge having a torsion angle set in an inclusive range of 5° to 60°.

32. The apparatus of claim 31, wherein said at least one spiral edge of said spiral roller does not include a cutting edge and a rake angle is set in an inclusive range of +60° to −10°.

33. The apparatus of claim 32, wherein a relief angle of said at least one spiral edge of said spiral roller is set to be 0°, within a predetermined manufacturing tolerance.

34. The apparatus of claim 31, wherein a length of said at least one spiral edge of said spiral roller is not greater than an effective separating width of the separating member.

35. The apparatus of claim 24, wherein said cleaning mechanism comprises a cover disposed at least underneath of said spiral roller so as to catch image forming substance removed by said spiral roller from said separating member.

36. The apparatus of claim 24, wherein said spiral roller comprises a cover having a hole formed therein through which image forming substance removed by said spiral roller may pass.

37. The apparatus of claim 24, further comprising a drying unit, comprising:
a heating drum having a heating lamp disposed therein, and
a pressing belt suspended on a plurality of supporting rollers and positioned to slidably move on an outer circumferential surface of the heating drum, wherein
said heating drum and said pressing belt being positioned to receive said image holding member therebetween after said image forming substance is transferred from said image holding member to said separating member, said image holding member being pressed by said pressing belt against said outer circumferential surface of said heating drum such that heat from said drum drys at least a portion of a liquid from said image holding member.

38. The apparatus of claim 24, wherein:
said separating member comprises an offset belt suspended about a plurality of rotatable rollers, a direction of movement of said offset belt following said predetermined path; and
said heating member comprises a winding roller having an internal heater, said predetermined path of said offset belt contacting an outer peripheral surface of said winding roller at a fixed location with respect to a center of said winding roller such that heat from said internal heater causing said image forming substance to soften prior to being transferred to said offset belt.

39. The apparatus of claim 38, wherein said plurality of rotatable rollers comprises at least one pressurizing roller positioned opposite to where said offset belt contacts said outer peripheral surface of said winding roller so as to keep said offset belt in contact with said outer peripheral surface, said offset belt passing between said at least one pressurizing roller and said winding roller.

40. The apparatus of claim 39, wherein said at least one pressurizing roller comprises a heater that imparts heat to said image forming substance when said image holding member passes between said at least one pressurizing roller and said winding roller.

41. The apparatus of claim 24, wherein:
said separating member comprises,
an offset belt suspended about a first set of rollers and configured to rotate along a first path in a first direction about said first set of rollers, a surface of said offset belt being said surface of said separating member, and an opposing belt suspended on a second set of rollers configured to rotate along a second path in a second direction about said second set of rollers, said first path and said second path coinciding over a predetermined interval and said image holding member being conveyed by said offset belt and said opposing belt over said predetermined interval; and said heating member comprises heating elements in at least one of said first set of rollers and said second set of rollers such that heat from said heating elements heats said image forming substance while said image holding member is conveyed by said offset belt and said opposing belt, said image forming substance adhering to said surface of said offset belt while in a softened state, wherein said first path and said second path depart from one another at a terminal end of said predetermined internal, said image forming substance separating from said image holding member at said terminal end.

42. The apparatus of claim 41 wherein said first set of rollers comprises a backup mechanism positioned opposite to said spiral roller such that said offset belt passes between said spiral roller and said backup mechanism, said backup mechanism comprising a backup roller.

43. The apparatus of claim 42, wherein said backup roller comprises an elastic material.

44. The apparatus of claim 41, wherein said cleaning mechanism further comprises a brush roller rotatably disposed against said surface of said offset belt.

45. The apparatus of claim 44, wherein said brush roller is disposed downstream of said rotatable spiral roller, where downstream is in reference to a moving direction of said surface of said offset belt.

46. The apparatus of claim 41, wherein said first set of rollers comprises tension rollers positioned to exert a tension force on said offset belt where a direction of said tension force is directed from said surface of said offset belt to another surface on an opposite side of said offset belt.

47. The apparatus of claim 41, wherein said opposing belt is configured to remove the image forming substance from an opposite side of said image holding member, such that said offset belt and said opposite belt cooperate to remove the image forming substance from both sides of the image holding member.

48. The apparatus of claim 24, wherein:
said separating member comprises a separating roller having a contact surface that serves as said surface of said separating member; and said heating member comprising a heating lamp disposed in an internal portion of said separating roller and configured to produce heat which heats and softens the image forming substance prior to being removed from said image holding member by said separating roller.

49. The apparatus of claim 48, wherein said heating lamp comprises a reflecting plate that directs heat from said heating lamp toward said contact surface.

50. The apparatus of claim 49, wherein said heating lamp and said reflecting plate being positioned to direct the heat toward a portion of the contact surface that is upstream of where said contact surface contacts said image forming substance, where upstream is in reference to a moving direction of said surface of said separating member.

51. The apparatus of claim 48, wherein said cleaning mechanism further comprises a brush roller rotatably disposed against said contact surface of said separating roller downstream of said spiral roller, where downstream is with respect to a moving direction of said separating roller.

52. The apparatus of claim 48, further comprising a cooling fan positioned to blow air against said image forming substance on said surface of said separating roller so as to cool and solidify said image forming substance, said cooling fan being positioned downstream of where said separating roller initially contacts said image forming substance and upstream of said rotatable spiral roller, where down stream is in reference to a moving direction of said surface of said separating member and upstream is in reference to the moving direction of said surface of said separating member.

53. The apparatus of claim 52, wherein said cooling fan comprises a cooling nozzle that directs an air flow toward said separating roller from said cooling fan.

54. The apparatus of claim 29, wherein:
said heating member comprises said heating roller and said heating roller having a predetermined diameter;

said plurality of rotatable rollers comprises a separating roller being disposed downstream of where said image holding member contacts said surface of said separating member, said separating roller having a diameter that is smaller than said predetermined diameter of said heating roller; and said separating roller being positioned to cause a predetermined path of said separating member to curve away from a feed path of said image holding member so that the image forming substance adheres to said surface of said separating member and separates from said image holding member while said image forming substance remains in a softened state.

55. The apparatus of claim 54, further comprising a drying unit, comprising:
a heating drum having a heating lamp disposed therein, and a pressing belt suspended on a plurality of supporting rollers and positioned to slidably move on an outer circumferential surface of the heating drum, wherein said heating drum and said pressing belt being positioned to receive said image holding member there between after said image forming substance is transferred from said image holding member to said separating member, said image holding member being pressed by said pressing belt against said outer circumferential surface of said heating drum such that heat from said drum drys at least a portion of a liquid from said image holding member.

56. The apparatus of claim 30, wherein said backup member comprises said backup roller, an amount of time for a portion of said offset belt moving at a linear velocity of V1 to pass between a nipping width, Ln, of said backup roller and said spiral roller is set to be Ln/V1, and an edge portion of length L of said spiral roller being set to move at a linear velocity V2, such that $Ln/V1 \geq L/V2$.

57. The apparatus of claim 24, wherein a rotational speed of said spiral roller is not greater than 320 revolutions per minute.

58. The apparatus of claim 24, wherein said cleaning mechanism comprises at least another spiral roller rotatably positioned against said surface of said separating member and located downstream of said rotatable spiral roller by a predetermined distance, where downstream is in reference to a moving direction of said surface of said separating member.

59. The apparatus of claim 58, further comprising a spiral roller control mechanism configured to offset in time respective start rotation times of respective of said spiral rollers such that the offset in time compensates for said predetermined distance between respective of the spiral rollers.

60. The apparatus of claim 24, further comprising:
   a backup belt supported by backup rollers and rotatable in association with said separating member, wherein
   said separating member comprises an offset belt, a portion of said offset belt being positioned between said spiral roller and said backup belt,
   said backup rollers being positioned about a periphery of said spiral roller such that a nipping width, Ln, of said offset belt is set to be a predetermined width.

61. The apparatus of claim 60, wherein an amount of time for a portion of said offset belt moving at a linear velocity of V1 to pass through the nipping width, Ln, is set to be Ln/V1, and an edge portion of length L of said spiral roller being set to move at a linear velocity V2, such that Ln/V1 ≧ L/V2.

62. The apparatus of claim 61, further comprising a drying unit, comprising:
   a heating drum having a heating lamp disposed therein, and
   a pressing belt suspended on another plurality of supporting rollers and positioned to slidably move on an outer circumferential surface of the heating drum, wherein
   said heating drum and said pressing belt being positioned to receive said image holding member there between after said image forming substance is transferred from said image holding member to said separating member, said image holding member being pressed by said pressing belt against said outer circumferential surface of said heating drum such that heat from said drum drys at least a portion of a liquid from said image holding member.

63. An apparatus for removing an image forming substance from an image holding member, comprising:
   means for heating and softening the image forming substance on the image holding member;
   means for removing said image forming substance, comprising
      means for driving a contact surface into contact with said image forming substance on said image holding member while said image forming substance is heated by said means for heating and softening,
      means for separating said image holding member from said means for removing at a downstream position, with respect to a direction of driving of said means for driving, from a contact position on which said contact surface contacts said image holding member, so as to keep said image forming substance in a softened state when removed from said image holding member; and
   means for scraping said image forming substance from said contact surface without exerting a strong abrasive force on the contact surface so as to preserve a durability of the contact surface when repeatedly used in other image forming substance removing operations.

64. The apparatus of claim 63, wherein said means for scraping comprises means for press-contacting a spiral roller against said surface.

65. The apparatus of claim 64, wherein said means for scraping comprises means for rotating said spiral roller at a predetermined speed.

66. The apparatus of claim 63, further comprising means for removing residual image forming substance from said surface that was not previously removed by said means for scraping.

67. The apparatus of claim 63, further comprising means for cooling said image forming substance on said surface prior to being removed by said means for scraping.

68. The apparatus of claim 67, wherein said means for cooling comprises means for directing an air flow from said means for cooling toward said image forming substance on said surface.

69. The apparatus of claim 63 further comprising means for applying an opposing force to said surface, where said opposing force counteracts a force exerted on said surface by said means for scraping.

70. The apparatus of claim 63, wherein said means for scraping comprises means for collecting image forming substance scraped off of said surface by said means for scraping.

71. The apparatus of claim 63, further comprising means for applying a liquid to said image holding member.

72. The apparatus of claim 71, further comprising means for drying said image holding member after said image forming substance is removed therefrom by said means for separating.

73. The apparatus of claim 63, further comprising means for heating said image forming substance from a direction of said surface.

74. The apparatus of claim 63, further comprising another means for removing that removes image forming substance from another surface of said image holding member.

75. The apparatus of claim 64, wherein said means for heating comprises means for directing heat toward said contact surface of said means for removing at a position upstream, in a moving direction of said image holding member, of where said means for driving drives said contact surface into contact with said image forming substance.

76. The apparatus of claim 64, further comprising means for controlling an operational speed of at least one of a linear velocity of said surface and a rotational velocity of said spiral roller.

77. The apparatus of claim 64, wherein:
   said means for press-contacting comprises means for press-contacting a plurality of spiral rollers against said surface; and
   said means for scraping comprises means for coordinating a time when respective of said plurality of spiral rollers are actuated so as to compensate for distance separation of said plurality of spiral rollers with respect to a predetermined position on said surface.

78. The apparatus of claim 64, wherein said means for scraping comprises means for applying an opposing force over a nipping interval in said surface, where said opposing force opposes a force exerted on said surface by said spiral roller.

79. An apparatus for removing an image forming substance from an image holding member, comprising:
   a heating block positioned along a feed path in which said image holding member travels, heat from which softens said image forming substance when said image holding member is passed along said feed path proximate said heating block;
   an offset belt having a surface;
   a heating roller positioned opposite said heating block such that said heating block and said heating roller sandwich said offset belt there between, heat from said heating roller also heating and softening said image forming substance when said image forming substance is exposed thereto;
   a plurality of rotatable rollers about which said offset belt is suspended and move said offset belt along a predetermined path, a portion of said predetermined path bringing said surface into contact with said image forming substance proximate said heating block, said surface of said offset belt adhering to said image forming substance so as to remove said image forming substance from said image holding member while said image forming substance remains in a softened state;

a cooling fan positioned to blow air against said image forming substance on said surface of said offset belt as said image forming substance is conveyed with said offset belt along said predetermined path, said air causing said image forming substance to cool and solidify on said surface of said offset belt, said cooling fan being positioned downstream of where said surface of said offset belt initially contacts said image forming substance, where downstream is in reference to a moving direction of said surface of said offset belt, said cooling fan comprising,
a cooling fan nozzle that directs the air toward said offset belt; and a cleaning mechanism positioned downstream along said predetermined path of where said image forming substance is removed from said image holding member, said cleaning mechanism comprising,
a rotatable spiral roller having a peripheral edge that contacts said surface, said surface and said peripheral edge moving with respect to one another at a predetermined non-zero relative speed so that said peripheral edge removes at least a portion of said image forming substance from said surface,
a brush roller rotatably disposed against said surface of said offset belt and downstream of said spiral roller, where downstream is in reference to a moving direction of said surface of said offset belt, and
a backup roller positioned opposite to said spiral roller such that said offset belt passes between said spiral roller and said backup roller.

80. The apparatus of claim 79, further comprising:
a liquid container configured to hold a liquid therein, wherein said liquid has a property of lowering an adhesion of the image forming substance to the image holding member when applied thereto;
an application roller, rotatably disposed at least partially within said liquid container and contacting said liquid so as to raise a portion of said liquid to a predetermined portion of said application roller when the application roller is rotated; and
a drying unit, comprising,
a heating drum having a heating lamp disposed therein, and
a pressing belt suspended on a plurality of supporting rollers and positioned to slidably move on an outer circumferential surface of the heating drum, wherein said heating drum and said pressing belt being positioned to receive said image holding member there between after said image forming substance is transferred from said image holding member to said offset belt, said image holding member being pressed by said pressing belt against said outer circumferential surface of said heating drum such that heat from said drum drys at least a portion of the liquid from said image holding member.

81. An apparatus for removing an image forming substance from an image holding member, comprising:
a winding roller having an internal heater and positioned along a feed path in which said image holding member travels, heat from said winding roller causing said image forming substance to soften when said image holding member is exposed thereto;
an offset belt having a surface;
a plurality of rotatable rollers about which said offset belt is suspended and moved along a predetermined path that brings said surface into contact with said image forming substance while exposed to said heat, said surface of said offset belt adhering to said image forming substance so as to remove said image forming substance from said image holding member while said image forming substance remains in a softened state, said image forming substance separating from said image forming substance where the predetermined path of said offset belt deviates from a peripheral surface of said winding roller, said plurality of rollers comprising,
a plurality of heated pressurizing roller positioned opposite to where said offset belt contacts said peripheral surface of said winding roller so as to keep said offset belt in contact with said peripheral surface, said offset belt passing between said plurality of heated pressurizing roller and said winding roller, heat from said pressurizing rollers also heating and softening said image forming substance when said image forming substance is exposed thereto;

a cooling fan positioned to blow air against said image forming substance on said surface of said offset belt as said image forming substance is conveyed with said offset belt along said predetermined path, said air causing said image forming substance to cool and solidify on said surface of said offset belt, said cooling fan being positioned downstream of where said offset belt initially contacts said image forming substance, said cooling fan comprises a cooling fan nozzle that directs an air flow toward said offset belt from said cooling fan; and a cleaning mechanism being positioned downstream along said predetermined path, said cleaning mechanism comprising,
a rotatable spiral roller having a peripheral edge that contacts said surface, said surface and said peripheral edge moving with respect to one another at a predetermined non-zero relative speed so that said peripheral edge removes at least a portion of said image forming substance from said surface,
a brush roller rotatably disposed against said surface of said offset belt, being disposed downstream of said spiral roller, where downstream is in reference to a moving direction of said surface of said offset belt, and
a backup roller positioned opposite to said spiral roller such that said offset belt passes between said spiral roller and said backup roller.

82. An apparatus for removing an image forming substance from an image holding member, comprising:
a feed path along which said image holding member is fed;
an offset belt having a surface;
a first plurality of rotatable rollers about which said offset belt is suspended and moved along a predetermined path, said first plurality of rotatable rollers comprising first heated rollers that produce heat, said predetermined path of said offset belt bring said surface into contact with said image forming substance while exposed to said heat, said surface of said offset belt adhering to said image forming substance so as to remove said image forming substance from said image holding member while said image forming substance remains in a softened state as a result of said heat;

an opposing belt having another surface;

a second plurality of rotatable rollers about which said opposing belt is suspended and moved along another predetermined path which has a portion that coincides with said predetermined path of said offset belt, said second plurality of rotatable rollers comprising second heated rollers disposed along said portion that coincides with said offset belt, said portion that coincides serving as a portion of said feed path, said image forming substance separating from said image holding member where said predetermined path of said offset belt departs from said feed path;

a cleaning mechanism being positioned downstream of where said predetermined path of said offset belt departs from said feed path along said predetermined path, said cleaning mechanism comprising, a rotatable spiral roller having a peripheral edge that contacts said surface, said surface and said peripheral edge moving with respect to one another at a predetermined non-zero relative speed so that said peripheral edge removes at least a portion of said image forming substance from said surface, a brush roller rotatably disposed against said surface of said offset belt, being disposed downstream of said spiral roller, where downstream is in reference to a moving direction of said surface of said offset belt, and a backup roller positioned opposite to said spiral roller such that said offset belt passes between said spiral roller and said backup roller.

83. An apparatus for removing an image forming substance from an image holding member, comprising:

a rotatable separating roller, comprising,
   an outer surface at a periphery of said separating roller,
   an internal heating lamp that produces heat, and
   a reflecting plate that directs the heat toward a predetermined portion of said outer surface;

a rotatable heated pressurizing roller that rotates at generally a same speed and opposite direction of said separating roller, said heated pressurizing roller and said separating roller defining a portion of a feed path that conveys said image holding member therebetween and heats and softens said image forming substance as said image holding member passes between said heated pressurizing roller and said separating roller, the image forming substance adhering to the outer surface of the rotatable separating roller and being separated from said image holding member when said surface of said separating roller rotates away from said feed path and said image holding member;

a cooling fan positioned to blow air against said surface of said separating roller so as to cool said image forming substance being conveyed thereon, said cooling fan comprising a cooling fan nozzle that directs an air flow toward said surface of said separating roller; and a rotatable spiral roller being positioned downstream, in a moving direction of said separating roller, of said cooling fan and having a peripheral edge that contacts said surface of said separating roller and scrapes at least a portion of said image forming substance from said surface as a result of a relative motion of said separating roller and said peripheral edge; and a rotatable brush roller positioned downstream of said spiral roller and in contact with said surface, where downstream is in reference to a moving direction of said outer surface of said separating roller.

84. An apparatus for removing an image forming substance from an image holding member, comprising:

a feed path comprising feed rollers that cooperate to feed said image holding member therethrough;

a liquid container configured to hold a liquid therein, wherein said liquid has a property of lowering an adhesion of the image forming substance to the image holding member when applied thereto;

an application roller, rotatably disposed at least partially within said liquid container and contacting said liquid so as to raise a portion of said liquid to a predetermined portion of said application roller when the application roller is rotated, said application roller applying said liquid to said image holding member when said image holding member is transferred along the feed path;

a heating roller disposed along said feed path and downstream of said application roller, heat from said heating roller softening said image forming substance when said image forming substance is exposed to said heat, where downstream is in reference to a moving direction of said image holding member through said feed path;

an offset belt having a surface;

a heated pressing roller positioned opposite said heating roller such that said heating roller and said heated pressing roller sandwich said offset belt therebetween, heat from said heated pressing roller also heating and softening said image forming substance when said image forming substance is exposed thereto;

a plurality of rotatable rollers about which said offset belt is suspended and moved along a predetermined path, said offset belt being movably positioned such that said surface is brought into contact with said image forming substance while exposed to said heat, said surface of said offset belt adhering to said image forming substance so as to remove said image forming substance from said image holding member while said image forming substance remains in a softened state;

a rotatable spiral roller having a peripheral edge that contacts said surface, said surface and said peripheral edge moving with respect to one another at a predetermined non-zero relative speed so that said peripheral edge removes at least a portion of said image forming substance from said surface;

a backup roller positioned opposite said spiral roller such that said offset belt passes between said spiral roller and said backup roller; and a drying unit disposed downstream along said feed path of where said offset belt is sandwiched between said heating roller and said heated pressing roller, comprising,
   a heating drum having a heating lamp disposed therein, and
   a pressing belt suspended on a plurality of supporting rollers and positioned to slidably move on an outer circumferential surface of the heating drum, wherein said heating drum and said pressing belt being positioned to receive said image holding member therebetween after said image forming substance is transferred from said image holding member to said offset belt, said image holding member being pressed by said pressing belt against said outer circumferential surface of said heating drum such that heat from said drum drys at least a portion of the liquid from said image holding member, an amount of time for a portion of said offset belt moving at a linear velocity of V1 to pass between a nipping width, Ln, of said backup roller and said spiral roller is set to be Ln/V1, and an edge portion of length L of said spiral roller being set to move at a linear velocity V2, such that a condition $Ln/V1 \geq L/V2$ is satisfied.

85. An apparatus for removing an image forming substance from an image holding member, comprising:

a feed path comprising feed rollers that cooperate to feed said image holding member therethrough;

a liquid container configured to hold a liquid therein, wherein said liquid has a property of lowering an adhesion of the image forming substance to the image holding member when applied thereto;

an application roller, rotatably disposed at least partially within said liquid container and contacting said liquid so as to raise a portion of said liquid to a predetermined portion of said application roller when the application roller is rotated, said application roller applying said liquid to said image holding member when said image holding member is transferred along the feed path;

a heating roller disposed along said feed path and downstream of said application roller, where downstream is in reference to a moving direction of said image holding member along said feed path, heat from said heating roller softening said image forming substance when said image forming substance is exposed to said heat;

an offset belt having a surface;

a heated pressing roller positioned opposite said heating roller such that said heating roller and said heated pressing roller sandwich said offset belt there between, heat from said heated pressing roller also heating and softening said image forming substance when said image forming substance is exposed thereto;

a plurality of rotatable rollers about which said offset belt is suspended and moved along a predetermined path, said offset belt being movably positioned such that said surface is brought into contact with said image forming substance while exposed to said heat, said surface of said offset belt adhering to said image forming substance so as to remove said image forming substance from said image holding member while said image forming substance remains in a softened state;

a rotatable spiral roller having a peripheral edge that contacts said surface, said surface and said peripheral edge moving with respect to one another at a predetermined non-zero relative speed so that said peripheral edge removes at least a portion of said image forming substance from said surface;

a backup belt supported by a pair of backup rollers positioned about a periphery of said spiral roller such that a nipping width, Ln, of said offset belt between said backup belt and said spiral roller is set to be a predetermined width; and a drying unit disposed downstream along said feed path of where said offset belt is sandwiched between said heating roller and said heated pressing roller, comprising, a heating drum having a heating lamp disposed therein, and a pressing belt suspended on a plurality of supporting rollers and positioned to slidably move on an outer circumferential surface of the heating drum, wherein said heating drum and said pressing belt being positioned to receive said image holding member there between after said image forming substance is transferred from said image holding member to said offset belt, said image holding member being pressed by said pressing belt against said outer circumferential surface of said heating drum such that heat from said drum drys at least a portion of the liquid from said image holding member.

\* \* \* \* \*